US012641993B2

(12) United States Patent
He et al.

(10) Patent No.: US 12,641,993 B2
(45) Date of Patent: May 26, 2026

(54) PEROVSKITE-SILICON-BASED LAMINATED SOLAR CELL AND MANUFACTURING METHOD THEREFOR

(71) Applicant: LONGI SOLAR TECHNOLOGY(XI'AN) CO., LTD., Xi'an (CN)

(72) Inventors: Bo He, Xi'an (CN); Yongcai He, Xi'an (CN); Xin Dong, Xi'an (CN); Yonglei Wang, Xi'an (CN); Lei Ding, Xi'an (CN)

(73) Assignee: LONGI SOLAR TECHNOLOGY(XI'AN) CO., LTD., Xi'an (CN)

( * ) Notice: Subject to any disclaimer, the term of this patent is extended or adjusted under 35 U.S.C. 154(b) by 0 days.

(21) Appl. No.: 18/709,113

(22) PCT Filed: May 16, 2022

(86) PCT No.: PCT/CN2022/093153
§ 371 (c)(1),
(2) Date: May 10, 2024

(87) PCT Pub. No.: WO2023/082584
PCT Pub. Date: May 19, 2023

(65) Prior Publication Data
US 2025/0008830 A1    Jan. 2, 2025

(30) Foreign Application Priority Data

Nov. 12, 2021    (CN) ......................... 202111369100.8

(51) Int. Cl.
*H10K 71/15* (2023.01)
*H10K 30/40* (2023.01)
(Continued)

(52) U.S. Cl.
CPC ............. *H10K 71/15* (2023.02); *H10K 30/40* (2023.02); *H10K 30/57* (2023.02); *H10K 30/85* (2023.02);
(Continued)

(58) Field of Classification Search
None
See application file for complete search history.

(56) References Cited

U.S. PATENT DOCUMENTS

2016/0137915 A1*    5/2016    Han ...................... H10K 85/50
                                                                 438/82
2018/0309077 A1    10/2018    Bush et al.
(Continued)

FOREIGN PATENT DOCUMENTS

CN        103700769 A      4/2014
CN        107743530 A      2/2018
(Continued)

OTHER PUBLICATIONS

Machine translation of CN112186105A (Year: 2021).*
(Continued)

*Primary Examiner* — Ryan S Cannon
(74) *Attorney, Agent, or Firm* — Fish & Richardson P.C.

(57)    ABSTRACT

This present disclosure provides a perovskite-silicon-based laminated solar cell and a manufacturing method therefor. In one aspect, a method for manufacturing a solar cell includes: providing a substrate, where the substrate includes a silicon-based bottom solar cell, a charge combination layer, and a first carrier transport layer sequentially laminated. The first carrier transport layer has a textured structure. The method further includes forming, on the first carrier transport layer, a perovskite light absorption layer. Forming the perovskite light absorption layer includes forming a first perovskite layer based on a solution method performed with a perov-
(Continued)

skite solution, and forming the second perovskite layer based on a perovskite skeleton vacuum evaporation method.

6 Claims, 4 Drawing Sheets

(51) Int. Cl.

| | |
|---|---|
| *H10K 30/57* | (2023.01) |
| *H10K 30/85* | (2023.01) |
| *H10K 30/86* | (2023.01) |
| *H10K 71/16* | (2023.01) |
| *H10K 85/50* | (2023.01) |

(52) U.S. Cl.
CPC ........... *H10K 30/86* (2023.02); *H10K 71/164* (2023.02); *H10K 85/50* (2023.02)

(56) References Cited

U.S. PATENT DOCUMENTS

| | | | |
|---|---|---|---|
| 2020/0212243 A1 | 7/2020 | Kim et al. | |
| 2021/0091309 A1 | 3/2021 | Kim et al. | |
| 2021/0126147 A1* | 4/2021 | Lee ........................ | H10F 77/707 |
| 2021/0175450 A1 | 6/2021 | Kim et al. | |
| 2022/0140169 A1* | 5/2022 | Fujita ................... | H10F 10/164 |
| | | | 136/256 |
| 2023/0092881 A1* | 3/2023 | Lee ........................ | H10K 30/82 |
| | | | 136/256 |

FOREIGN PATENT DOCUMENTS

| | | |
|---|---|---|
| CN | 109216547 A | 1/2019 |
| CN | 110534653 A | 12/2019 |
| CN | 110970562 A | 4/2020 |
| CN | 111682113 A | 9/2020 |
| CN | 112086534 A | 12/2020 |
| CN | 112186105 A | 1/2021 |
| JP | 2010-206061 A | 9/2010 |
| JP | 2018-518845 A | 7/2018 |
| WO | WO 2018123402 A1 | 7/2018 |

OTHER PUBLICATIONS

Machine translation of WO2023/082584A1 (Year: 2023).*
Communication Pursuant to Rules 70(2) and 70a(2) EPC in European Appln. No. 22891394.3, dated Apr. 1, 2025, 1 page.
Extended European Search Report in European Appln. No. 22891394.3, mailed on Mar. 13, 2025, 13 pages.
Notice of Reasons for Refusal in Japanese Appln. No. 2024-527766, dated Mar. 27, 2025, 8 pages (with English Translation).
Schulze et al., "Perovskite hybrid evaporation/spin coating method: From band gap tuning to thin film deposition on textures," Thin Solid Films, Jun. 2020, 704:137970, 11 pages.
Vaynzof et al., "The Future of Perovskite Photovoltaics-Thermal Evaporation or Solution Processing?" Advanced Energy Materials, Nov. 2020, 10(48):2003073, 9 pages.
Werner et al., "Perovskite/Perovskite/Silicon Monolithic Triple-Junction Solar Cells with a Fully Textured Design," ACS Energy Letters, Aug. 2018, 3(9):2052-2058.
Office Action in Chinese Appln. No. 202111369100.8, mailed on Jun. 24, 2025, 17 pages (with English translation).
International Preliminary Report on Patentability in International Appln. No. PCT/CN2022/093153, mailed on May 23, 2024, 10 pages (with English translation).
International Search Report and Written Opinion in Appln. No. PCT/CN2022/093153, mailed on Aug. 2, 2022, 11 pages (with English translation).

\* cited by examiner

108

1090

108

1090

1091

108

113
112
111
1101 ⎱110
1100 ⎰
109
108
1071 ⎱107
1070 ⎰
104
102
101
103
105
106

113

PEROVSKITE-SILICON-BASED LAMINATED SOLAR CELL AND MANUFACTURING METHOD THEREFOR

CROSS-REFERENCE TO RELATED APPLICATIONS

This application is a National Stage of International Application No. PCT/CN2022/093153, filed on May 16, 2022, which claims priority to Chinese Patent Application No. 202111369100.8, filed on Nov. 12, 2021. Both of the aforementioned applications are hereby incorporated by reference in their entireties.

TECHNICAL FIELD

This application relates to the field of laminated solar energy technologies, and in particular, to a perovskite-silicon-based laminated solar cell and a manufacturing method therefor.

BACKGROUND

A perovskite-silicon-based laminated solar cell is manufactured by using a silicon-based solar cell as a bottom solar cell, a perovskite solar cell as a top solar cell, and a tunneling recombination layer connected between the bottom solar cell and the top solar cell.

In the process of manufacturing the perovskite-silicon-based laminated solar cell, functional layers of the perovskite solar cell need to be evenly spin-coated on a pyramid-type textured light trapping structure of the silicon-based solar cell. However, the functional layers of the perovskite solar cell are only a few hundred nanometers thick, and cannot be easily deposited on the micron-scale pyramid-type textured light trapping structure by using a solution spin coating method. Although polishing the bottom solar cell to reduce roughness of the textured light trapping structure makes it possible to prepare the perovskite solar cell through solution spin coating, the solar cell efficiency gain brought by the textured light trapping structure is lost, and manufacturing costs are also greatly increased. Therefore, how to obtain a high-efficiency perovskite-silicon-based laminated solar cell while retaining the textured structure of the bottom solar cell is a problem that needs to be resolved currently.

SUMMARY

An objective of this application is to provide a perovskite-silicon-based laminated solar cell and a manufacturing method therefor, to obtain a perovskite-silicon-based laminated solar cell that has both a high open-circuit voltage and a high short-circuit current while retaining a textured structure of a bottom solar cell.

According to a first aspect, this application provides a method for manufacturing a perovskite-silicon-based laminated solar cell, including:

providing a substrate, where the substrate includes a silicon-based bottom solar cell having a textured structure, a charge combination layer, and a first carrier transport layer sequentially laminated; and forming, on the first carrier transport layer having the textured structure, a perovskite light absorption layer formed by a first perovskite layer and a second perovskite layer, where the first perovskite layer is prepared by using a solution method, and the second perovskite layer is prepared by using a perovskite skeleton vacuum evaporation method.

By using the foregoing technical scheme, the first perovskite layer and the second perovskite layer formed on the first carrier transport layer having the textured structure form the perovskite light absorption layer, where the first perovskite layer is prepared by using the solution method, and the second perovskite layer is prepared by using the perovskite skeleton vacuum evaporation method. In the perovskite skeleton vacuum evaporation method, a mixture of $PbX_2$ and CsY is first formed through vacuum evaporation to form a perovskite skeleton, where X and Y each are selected from one or more of a chloride ion ($Cl^-$), a bromide ion ($Br^-$), an iodide ion ($I^-$), or a thiocyanate ion ($SCN^-$), and the mixture of $PbX_2$ and CsY may be a mixture of two or three or more materials, and is preferably a mixture of lead iodide and cesium iodide or a mixture of lead iodide and cesium bromide; and then, an organic amine solution covers the perovskite skeleton in an existing solution coating manner such as solution spin coating, knife coating, or spray coating, to form a perovskite thin film through reaction. The formed second perovskite layer can conformally cover peaks and ramp surfaces of the textured structure, and the first perovskite layer formed by using the solution method can be laminated on and partially fill the bottom of the textured structure. Based on this, the perovskite light absorption layer formed by the foregoing two perovskite layers has advantages of both the solution method and the vacuum evaporation method, and also avoids disadvantages of the two methods; and a good light trapping effect and anti-reflection effect of the textured structure are well retained to obtain a high short-circuit current, and a solution component can be conveniently regulated to obtain a required wide band gap and a high open-circuit voltage. It can be learned that, compared with the related art, by using the method for manufacturing a perovskite-silicon-based laminated solar cell provided in this application, a conflict between conformation of the textured structure and regulation of a perovskite component is well balanced, thereby greatly widening a process regulation window and a range of selection of components and materials for preparation of a high-efficiency laminated solar cell.

In some possible implementations, when an average vertical distance between lowest ends and highest ends of the textured structure of the first carrier transport layer is L, a range of an average thickness of the first perovskite layer prepared by using the solution method is greater than 0 and less than or equal to $\frac{1}{2}L$. In this case, the first perovskite layer prepared by using the solution method is laminated on the bottom of the textured structure of the first carrier transport layer, and a thickness of the first perovskite layer is less than or equal to half of a height of the textured structure. Based on this, the formed perovskite light absorption layer can maintain good textured characteristics. To be specific, when the perovskite light absorption layer is subjected to light, the textured structure of the first carrier transport layer can improve photoelectric conversion efficiency by using the light trapping effect and the anti-reflection effect. When the thickness of the first perovskite layer prepared by using the solution method is greater than half of the height of the textured structure, the formed perovskite light absorption layer has a small part of the height of the textured structure, and has a high reflectivity to light, resulting in low photoelectric conversion efficiency.

In some possible implementations, the forming, on the first carrier transport layer having the textured structure, a perovskite light absorption layer formed by a first perovskite layer and a second perovskite layer includes: preparing, on the first carrier transport layer having the textured structure, the first perovskite layer by using the solution method; and preparing the second perovskite layer by using the perovskite skeleton vacuum evaporation method.

By using the foregoing technical scheme, a two-step method of first using the solution method and then using the perovskite skeleton vacuum evaporation method may be used to prepare the perovskite light absorption layer. Specifically, the first perovskite layer is first formed on the first carrier transport layer having the textured structure by using the solution method, and then the second perovskite layer is formed on the first perovskite layer by using the perovskite skeleton vacuum evaporation method. Based on this, the first perovskite layer prepared by using the solution method is laminated on the bottom of the textured structure of the first carrier transport layer, so that a perovskite band gap can be regulated by changing a component of a perovskite solution; and the second perovskite layer prepared by using the perovskite skeleton vacuum evaporation method conformally covers the first perovskite layer and an unfilled part of the textured structure without changing the textured structure, so that the textured structure is retained to obtain a good light trapping effect and anti-reflection characteristic, and it is also ensured that the textured structure is covered, to avoid a short circuit caused by direct contact between an electrode and the textured structure. The laminated solar cell manufactured by using the method has advantages of existing laminated solar cell schemes, and avoids disadvantages faced in the related art, thereby well balancing the conflict between conformation of the textured structure and regulation of the solution component.

In some possible implementations, the forming, on the first carrier transport layer having the textured structure, a perovskite light absorption layer formed by a first perovskite layer and a second perovskite layer includes: preparing the second perovskite layer on the first carrier transport layer having the textured structure by using the perovskite skeleton vacuum evaporation method, and preparing the first perovskite layer by using the solution method.

By using the foregoing technical scheme, a two-step method of first using the perovskite skeleton vacuum evaporation method and then using the solution method may be used to prepare the perovskite light absorption layer. Specifically, the second perovskite layer is first formed on the first carrier transport layer having the textured structure by using the perovskite skeleton vacuum evaporation method, and then the first perovskite layer is formed on the second perovskite layer by using the solution method. Based on this, the second perovskite layer prepared by using the perovskite skeleton vacuum evaporation method conformally conforms to the textured structure of the first carrier transport layer, so that the textured structure is retained to obtain a good light trapping effect and anti-reflection characteristic; and the first perovskite layer prepared by using the solution method is laminated on the bottom of the textured structure, which is conducive to obtaining a high open-circuit voltage.

In some possible implementations, the forming, on the first carrier transport layer having the textured structure, a perovskite light absorption layer formed by a first perovskite layer and a second perovskite layer includes: evaporating a perovskite skeleton on the first carrier transport layer having the textured structure by using the vacuum evaporation method, and preparing the first perovskite layer by using the solution method, where a solution used in the solution method includes an excess amount of an organic amine; and in a process of forming the first perovskite layer, a material in the perovskite skeleton reacts with the organic amine to form the second perovskite layer.

By using the foregoing technical scheme, in the method in which the second perovskite layer is first prepared by using the perovskite skeleton vacuum evaporation method and then the first perovskite layer is prepared by using the solution method, the perovskite skeleton may alternatively be first vacuum-evaporated and then the first perovskite layer and the second perovskite layer are simultaneously prepared by using a one-step method. When the solution used in the solution method is coated on the perovskite skeleton, the excess amount of the organic amine included in the solution reacts with the perovskite skeleton to form the second perovskite layer. The formed second perovskite layer conformally covers the textured structure. The first perovskite layer prepared by using the solution method is deposited on and partially fills the bottom of the textured structure covered by the second perovskite layer, to form the perovskite light absorption layer.

In some possible implementations, a solute of the solution used in the solution method is a hybrid perovskite component $Cs_xFA_yMA_zPbBr_mI_n$ (x+y+z=1, and m+n=3) including Cs or FA or MA, and a solvent of the solution used in the solution method is one or more of N,N-dimethylformamide or dimethylsulfoxide. In the method in which the perovskite skeleton is first vacuum-evaporated and then the first perovskite layer and the second perovskite layer are simultaneously prepared by using the one-step method, the used solution includes lead iodide meeting the foregoing ratio and a mixed component of formamidine hydroiodide, methylamine bromide, and formamidine hydrobromide, and also includes an organic amine component in excess of the foregoing stoichiometric ratio. The excess amount of the organic amine component reacts with the perovskite skeleton to form the second perovskite layer conformally covering the textured structure.

In some possible implementations, the perovskite skeleton vacuum evaporation method includes: forming the perovskite skeleton through vacuum evaporation, and forming the second perovskite layer through reaction between the perovskite skeleton and the organic amine, where the perovskite skeleton is a mixture formed by two or three or more of $PbX_2$ or CsY, X and Y each are selected from one or more of $Cl^-$, $Br^-$, $I^-$, or $SCN^-$, the mixture is preferably a mixture of lead iodide and cesium iodide or a mixture of lead iodide and cesium bromide, and the organic amine is one or more of formamidine hydroiodide, methylamine bromide, or formamidine hydrobromide. A main component of the perovskite skeleton is preferably the mixture of lead iodide and cesium iodide or the mixture of lead iodide and cesium bromide. During vacuum evaporation of the perovskite skeleton, lead iodide and cesium iodide, or lead iodide and cesium bromide may be jointly vacuum-evaporated as required, to regulate a size of the perovskite band gap to obtain a high open-circuit voltage.

In some possible implementations, a concentration of the solution used in the solution method ranges from 0.2 mol/L to 3 mol/L. In a process in which the perovskite skeleton is first vacuum-evaporated and then the first perovskite layer and the second perovskite layer are simultaneously prepared by using the one-step method, if the concentration of the solution used in the solution method is excessively small, the solvent of the solution used in the solution method may quickly dissolve lead iodide in the perovskite skeleton and throw lead iodide out of the textured structure during coating. As a result, the perovskite skeleton is damaged, and a uniform and continuous perovskite thin film cannot be formed. Preferably, when the concentration of the solution used in the solution method is greater than 1 mol/L, the solvent slowly dissolves lead iodide in perovskite or even has no time to dissolve underlying lead iodide during coating, thereby ensuring conformality of the perovskite thin film on the textured structure.

In some possible implementations, the perovskite skeleton vacuum evaporation method includes: spin-coating an organic amine solution on the perovskite skeleton, where a rotation speed of spin coating ranges from 500 rpm to 6000 rpm, and a range of a thickness of the perovskite skeleton is from 50 nm to 1000 nm.

In some possible implementations, after the perovskite light absorption layer is formed, the method for manufacturing a perovskite-silicon-based laminated solar cell further includes: sequentially forming a second carrier transport layer, a transparent conductive layer, and an electrode on the perovskite light absorption layer.

According to a second aspect, this application further provides a perovskite-silicon-based laminated solar cell, manufactured by using the foregoing method for manufacturing a perovskite-silicon-based laminated solar cell.

Beneficial effects of the perovskite-silicon-based laminated solar cell provided in the second aspect are the same as those of the method for manufacturing a perovskite-silicon-based laminated solar cell described in the first aspect or any of the possible implementations of the first aspect. Details are not described herein again.

According to a third aspect, this application further provides a perovskite-silicon-based laminated solar cell, including a silicon-based bottom solar cell having a textured structure, a charge combination layer, and a first carrier transport layer sequentially laminated, and a perovskite light absorption layer covering the first carrier transport layer having the textured structure, where the perovskite light absorption layer is formed by a first perovskite layer and a second perovskite layer; and the first perovskite layer is prepared by using a solution method, and the second perovskite layer is prepared by using a perovskite skeleton vacuum evaporation method.

Beneficial effects of the perovskite-silicon-based laminated solar cell provided in the third aspect are the same as those of the method for manufacturing a perovskite-silicon-based laminated solar cell described in the first aspect. Details are not described herein again.

In some possible implementations, the first perovskite layer is at least distributed at valleys of the textured structure of the first carrier transport layer, and an average thickness of the first perovskite layer is less than or equal to ½ of a height of the textured structure; and a part of a structure of the second perovskite layer is at least distributed on ramp surfaces and tops of the textured structure, and same textured shapes as the ramp surfaces and the tops are maintained on the ramp surfaces and the tops. The perovskite-silicon-based laminated solar cell formed based on this has good conformality, to retain a good light trapping effect and anti-reflection effect of the textured structure to obtain a high short-circuit current. In addition, manufacturing of the perovskite-silicon-based laminated solar cell is easier to implement compared with direct formation of a conformal perovskite structure, and a solution component can also be conveniently regulated to obtain a required wide band gap and a high open-circuit voltage.

In some possible implementations, a range of a thickness of the first carrier transport layer is from 5 nm to 200 nm, and a range of an average thickness of the perovskite light absorption layer is from 100 nm to 3000 nm.

In some possible implementations, a range of an average thickness of the first perovskite layer is from 100 nm to 300 nm, and a range of a thickness of the second perovskite layer is from 100 nm to 3000 nm.

The foregoing descriptions are merely an overview of the technical schemes in this application. In order that technical means of this application can be understood more clearly so that the technical schemes can be implemented according to content of the descriptions, and in order that the foregoing and other objectives, features, and advantages of this application can be understood more clearly, specific implementations of this application are described below.

BRIEF DESCRIPTION OF THE DRAWINGS

To describe technical schemes in embodiments of this application or the related art more clearly, the following briefly introduces accompanying drawings required for describing the embodiments or the related art. Apparently, the accompanying drawings in the following descriptions show some of the embodiments of this application, and a person of ordinary skill in the art still derives other drawings from these accompanying drawings without creative efforts.

REFERENCE NUMERALS

Figure 1:
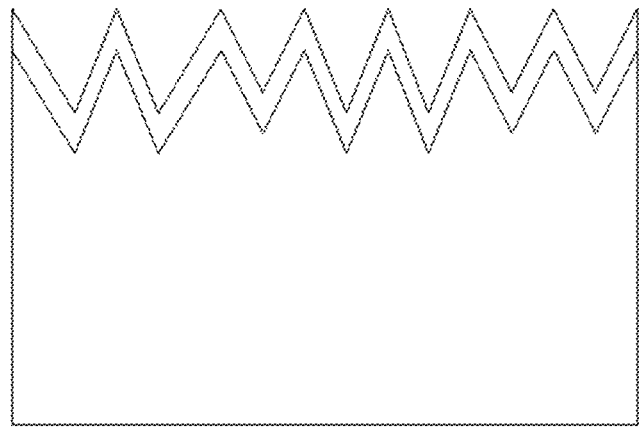
FIG. 1 is a schematic diagram of a perovskite light absorption layer prepared by using only a solution method in the related art.

101—n-type crystalline silicon wafer, 102—first passivation layer, 103—second passivation layer, 104—n-type amorphous/microcrystalline silicon layer, 105—p-type amorphous/microcrystalline silicon layer, 106—first transparent conductive layer, 107—charge combination layer, 1070—n-type doped microcrystalline silicon layer, 1071—p-type doped microcrystalline silicon layer, 108—first carrier transport layer, 109—perovskite light absorption layer, 110—second carrier transport interface layer, 1100—second carrier transport interface layer 1, 1101—second carrier transport interface layer 2, 111—second carrier transport layer, 112— second transparent conductive layer, 113—electrode, 1090—first perovskite layer, and 1091—second perovskite layer.

DETAILED DESCRIPTION

To make the objectives, technical schemes, and advantages of the embodiments of this application clearer, the following clearly and completely describes the technical schemes in the embodiments of this application with reference to the accompanying drawings in the embodiments of this application. Apparently, the described embodiments are some rather than all of the embodiments of this application. All other embodiments obtained by a person of ordinary skill in the art based on the embodiments of this application without creative efforts shall fall within the protection scope of this application.

It should be noted that, when an element is referred to as "being fixed to" or "being arranged on" another element, the element may be directly on the another element, or may be indirectly on the another element. When an element is referred to as "being connected to" another element, the element may be directly connected to the another element, or may be indirectly connected to the another element.

In addition, the terms "first" and "second" are used for descriptive purposes only and are not to be construed as indicating or implying relative importance or implicitly indicating the number of technical features indicated. Therefore, a feature defined by "first" or "second" may explicitly or implicitly include one or more features. In the descriptions of this application, unless otherwise explicitly specified, "plurality of" means two or more than two; and unless otherwise explicitly specified, "several" means one or more than one.

In the descriptions of this application, it should be understood that orientation or position relationships indicated by terms such as "upper", "lower", "front", "rear", "left", and "right" are based on orientation or position relationships shown in the accompanying drawings, and are used only for ease of describing this application and simplifying the descriptions, rather than indicating or implying that the mentioned apparatus or component needs to have a particular orientation or needs to be constructed and operated in a particular orientation. Therefore, such terms should not be construed as limiting of this application.

Hybrid organic-inorganic perovskite solar cells gain widespread attention worldwide as novel high-efficiency and cost-effective solar cells. During a few years, photoelectric conversion efficiency of the perovskite solar cells rapidly has climbed from 3.8% in 2009 to 25% or more, which is close to efficiency of commercial-grade silicon-based solar cells. Crystalline silicon solar cell is a high-efficiency crystalline silicon photovoltaic solar cell technology, and its solar cell efficiency (26.7%) is already close to a theoretical efficiency limit (29.4%). A laminated solar cell technology is an effective way to break through efficiency of conventional crystalline silicon photovoltaic solar cells. As a multi-component solar cell, a band gap of an absorption spectrum of a perovskite solar cell may be regulated in a range of 1.5 to 1.8 eV by changing the formulation of components. Perovskite is an ideal material for a laminated top solar cell. A crystalline silicon-perovskite laminated solar cell uses a crystalline silicon solar cell as a bottom solar cell to absorb sunlight energy ranging from 800 nm to 1200 nm and a perovskite solar cell as a top solar cell to absorb sunlight energy ranging from 300 nm to 800 nm, and the bottom solar cell and the top solar cell is connected in series by a charge combination layer. An overall open-circuit voltage of the laminated solar cell is a sum of voltages of the top solar cell and the bottom solar cell, and for a current of the laminated solar cell, a good current match between the top solar cell and the bottom solar cell is required. The crystalline silicon-perovskite laminated solar cell is expected to achieve photoelectric conversion efficiency of 30% or more.

Currently, there are a plurality of documents reporting that conversion efficiency of 25% or more is achieved in the crystalline silicon-perovskite laminated solar cell. Functional layers in a typical perovskite solar cell are prepared by using a solution spin coating method. 0.

Figure 2:
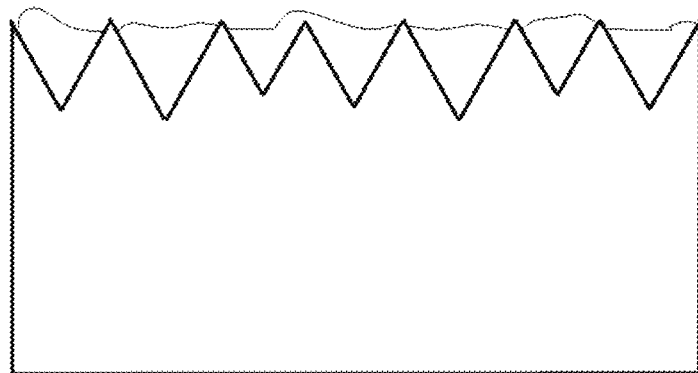
FIG. 2 is a schematic diagram of a perovskite light absorption layer prepared by using only a vacuum evaporation method in the related art.

A high-efficiency crystalline silicon solar cell generally uses a double-sided textured light trapping structure to improve absorption and utilization of sunlight, thereby improving conversion efficiency of the solar cell. A micron-scale pyramid-type textured light trapping structure in the crystalline silicon solar cell is a huge challenge for preparing a perovskite top solar cell by using the solution method. A difficulty is that the functional layers of the perovskite solar cell are generally a few hundred nanometers thick, and cannot be uniformly and conformally deposited on a surface of the micron-scale pyramid-type textured structure by using the solution spin coating method. In a current scheme, polishing a crystalline silicon bottom solar cell to reduce roughness of the textured structure makes it possible to prepare the perovskite top solar cell by using the solution method. Although the method can prepare the perovskite top solar cell and the laminated solar cell through solution processing, the solar cell efficiency gain brought by the textured structure and a light trapping effect thereof is sacrificed. In addition, the polishing process greatly increases manufacturing costs of the entire solar cell, and it is difficult to reflect the advantage of the efficiency gain of the laminated solar cell. How to retain the textured structure of the bottom solar cell and directly prepare the perovskite solar cell on the textured structure of the bottom solar cell is a key to achieving high efficiency of the laminated solar cell. Currently, there are two technical schemes to prepare the perovskite laminated solar cell on the crystalline silicon bottom solar cell having the textured structure. As shown in FIG. 1 and FIG. 2, in a first scheme, first, a lead iodide thin film is conformally evaporated on the textured structure, and an organic amine solution is spin-coated and in-situ reaction is performed to form perovskite. In the method, lead iodide plays an anchor role, ensuring that perovskite conformally forms a film as the textured structure undulates. In a second scheme, a substrate having a small-textured (for example, a 2-micron-scale textured) structure is prepared, and a perovskite solution is directly spin-coated on the small-textured structure to prepare a perovskite thin film by using a one-step method. Spin coating on the small-textured structure by using the one-step method requires that a thickness of the perovskite thin film is regulated through parameters such as a solution concentration and a rotation speed, to ensure that peaks of textured pyramids can be fully covered while the thickness is not too thick. Both the foregoing schemes have limitations. In the first scheme, because the evaporated lead iodide thin film is dense and has low component reactivity, it is difficult for the spin-coated organic amine solution to penetrate to the bottom and completely react with lead iodide, and it is difficult to ensure that an organic amine uniformly and completely reacts with the lead iodide thin film and form large-sized perovskite grains during spin coating. As a result, it is difficult to obtain a perovskite top solar cell with a wide band gap and a high open-circuit voltage through component regulation. Currently, it is reported in the literature that highest conversion efficiency based on the scheme is only 25.4%, and a difficulty is a limitation of component regulation. In the second scheme, a component can be easily regulated to obtain a wide band gap and a high open-circuit voltage. However, the formed thin film has no conformality, a lower part of the thin film fills valleys of the textured structure, and an upper part of the thin film is a planar. As a result, an anti-reflection characteristic of the textured structure is lost, a reflectivity is high, and a current is low due to low absorption of the textured structure. Therefore, it is necessary to develop a method for depositing a perovskite thin film on a crystalline silicon solar cell having a large-textured structure, to obtain a laminated solar cell that has both a high opening-circuit voltage and a high current, to obtain a high-efficiency crystalline silicon-perovskite laminated solar cell.

To resolve the foregoing technical problems, an embodiment of this application provides a method for manufacturing a perovskite-silicon-based laminated solar cell.

As shown in FIG. 3 to FIG. 8, the method for manufacturing a perovskite-silicon-based laminated solar cell provided in this application includes the following steps.

Provide a substrate, where the substrate includes a silicon-based bottom solar cell having a textured structure, a charge combination layer 107, and a first carrier transport layer 108 sequentially laminated.

First, a silicon-based solar cell is provided. By using an n-type silicon-based bottom solar cell as an example, a method for manufacturing the n-type silicon-based bottom solar cell may include the following steps.

An n-type crystalline silicon wafer 101 is provided. In actual applications, the n-type crystalline silicon wafer 101 may be selected as a commercial-grade silicon wafer with a resistivity of 1 $\Omega \cdot cm$ to 10 $\Omega \cdot cm$ and a thickness of 50 $\mu m$ to 300 $\mu m$.

Texturizing and cleaning are sequentially performed on the n-type crystalline silicon wafer 101, to form the n-type crystalline silicon wafer 101 having the textured structure. As a light absorption layer of the silicon-based bottom solar cell, the n-type crystalline silicon wafer 101 converts photons into photo-generated carriers (electron-hole pairs).

Intrinsic amorphous silicon passivation layers are deposited on two sides of the n-type crystalline silicon wafer 101, to form a first passivation layer 102 located on a front side of the n-type crystalline silicon wafer 101 and a second passivation layer 103 located on a back side of the n-type crystalline silicon wafer 101. The first passivation layer 102 and the second passivation layer 103 mainly play a role of passivating dangling bonds on surfaces of the n-type crystalline silicon wafer 101.

In actual applications, the intrinsic amorphous silicon passivation layers each may be manufactured by using a process such as plasma enhanced chemical vapor deposition (PECVD), hot wire chemical vapor deposition, or catalytic chemical vapor deposition. Thicknesses of the first passivation layer 102 and the second passivation layer 103 each may range from 1 nm to 20 nm.

An n-type phosphorus-doped amorphous/microcrystalline silicon layer 104 is deposited on the first passivation layer 102, to form a front-side emitter electrode. In actual applications, the n-type amorphous/microcrystalline silicon layer 104 may be manufactured by using a process such as PECVD, hot wire chemical vapor deposition, or catalytic chemical vapor deposition. A thickness of the n-type amorphous/microcrystalline silicon layer 104 may range from 1 nm to 30 nm.

A p-type boron-doped amorphous/microcrystalline silicon layer 105 is deposited on the second passivation layer 103, to form a back-field structure. In actual applications, the p-type amorphous/microcrystalline silicon layer 105 may be manufactured by using a process such as PECVD, hot wire chemical vapor deposition, or catalytic chemical vapor deposition. A thickness of the p-type amorphous/microcrystalline silicon layer 105 may range from 1 nm to 30 nm.

A first transparent conductive layer 106 is formed on the p-type amorphous/microcrystalline silicon layer 105. The first transparent conductive layer 106 mainly plays a role of collecting photo-generated carriers and transporting the photo-generated carriers to a back metal electrode 113. Specifically, a material of the first transparent conductive layer 106 may include one or more of indium tin oxide (ITO), tungsten-doped indium oxide ($In_2O_3$:W, abbreviated as IWO), indium zinc oxide (IZO), or titanium-doped indium oxide (ITiO), and is not limited thereto.

In actual applications, the first transparent conductive layer 106 may be manufactured by using a magnetron sputtering process. A thickness of the first transparent conductive layer 106 may range from 30 nm to 120 nm.

The silicon-based bottom solar cell is manufactured through the foregoing process steps. Because the crystalline silicon substrate has the textured structure, functional layers formed on the crystalline silicon substrate, namely, the first passivation layer 102, the second passivation layer 103, the n-type amorphous/microcrystalline silicon layer 104, the p-type amorphous/microcrystalline silicon layer 105, and the first transparent conductive layer 106, also have the textured structure.

The charge combination layer 107 is deposited on the n-type amorphous/microcrystalline silicon layer 104, to implement tunneling, recombination, and collection of the photo-generated carriers. The charge combination layer 107 may be a charge combination layer 107 made of transparent metal oxide such as tin-doped indium oxide (ITO), zinc-doped indium oxide (IZO), tungsten-doped indium oxide (IWO), titanium-doped indium oxide (ITiO), fluorine-doped tin oxide (FTO), or aluminum-doped zinc oxide (AZO). In actual applications, the charge combination layer 107 may be manufactured by using the magnetron sputtering process.

Certainly, the charge combination layer 107 may alternatively be a charge combination layer 107 made of heavily doped silicon opposite to a pn junction of the bottom solar cell. For example, the charge combination layer 107 is a charge combination layer 107 mainly formed by an n-type doped microcrystalline silicon layer 1070 and a p-type doped microcrystalline silicon layer 1071, where the p-type doped microcrystalline silicon layer 1071 is close to a perovskite solar cell described below, and the n-type doped microcrystalline silicon layer 1070 is close to the silicon-based bottom solar cell. Specifically, the n-type doped microcrystalline silicon layer 1070 may be a phosphorus-doped microcrystalline silicon layer, and the p-type doped microcrystalline silicon layer 1071 may be a boron-doped microcrystalline silicon layer. In actual applications, the charge combination layer 107 may be manufactured by using a process such as PECVD, hot wire chemical vapor deposition, or catalytic chemical vapor deposition. Thicknesses of the n-type doped microcrystalline silicon layer 1070 and the p-type doped microcrystalline silicon layer 1071 each may range from 1 nm to 30 nm.

That the perovskite solar cell is formed on the charge combination layer 107 specifically includes the following step.

Form the first carrier transport layer 108 on the charge combination layer 107, to implement vertical transport of photo-generated carriers. A material of the first carrier transport layer 108 may include poly[bis(4-phenyl)(2,4,6-trimethylphenyl)amine](PTAA), 2,2',7,7'-tetrakis-(dimethoxydiphenylamine)-spirofluorene (Spiro-OMeTAD), 2,2', 7,7'-tetrakis(di-p-tolylamino)spiro-9,9'-bifluorene (Spiro-TTB), or nickel oxide (NiO), and is not limited thereto.

In actual applications, the first carrier transport layer 108 may be manufactured by using a process such as magnetron sputtering, laser pulse deposition, thermal evaporation coating, chemical vapor deposition, solution coating, or gel-sol or hydrothermal synthesis of nanoparticles. A range of a thickness of the first carrier transport layer 108 may be from 5 nm to 200 nm.

A perovskite light absorption layer 109 is formed on the first carrier transport layer 108. A component of the perovskite light absorption layer 109 is a combination of one or more perovskite-structural materials. A general chemical formula of a perovskite material may be $ABX_3$, where A is one or more of a $CH_3NH_3$ cation, a $C_4H_9NH_3$ cation, an $NH_2$=$CHNH_2$ cation, or a Cs cation; B is one or a combination of two of $Pb^{2+}$ or $Sn^{2+}$; and X is one or more of $I^-$, $Cl^-$, or $Br^-$.

As shown in FIG. 3 to FIG. 7, manufacturing of the perovskite light absorption layer 109 includes the following step.

Form, on the first carrier transport layer 108 having the textured structure, the perovskite light absorption layer 109 formed by a first perovskite layer 1090 and a second perovskite layer 1091, where the first perovskite layer 1090 is prepared by using a solution method, and the second perovskite layer 1091 is prepared by using a perovskite skeleton vacuum evaporation method.

In this case, the first perovskite layer 1090 and the second perovskite layer 1091 formed on the first carrier transport layer 108 having the textured structure by using the two-step method form the perovskite light absorption layer 109, where the first perovskite layer 1090 is prepared by using the solution method, and the second perovskite layer 1091 is prepared by using the perovskite skeleton vacuum evaporation method. In the perovskite skeleton vacuum evaporation method, a mixture of $PbX_2$ and CsY is first formed through vacuum evaporation to form a perovskite skeleton, where X and Y each are selected from one or more of a chloride ion ($Cl^-$), a bromide ion ($Br^-$), an iodide ion ($I^-$), or a thiocyanate ion ($SCN^-$), and the mixture of $PbX_2$ and CsY may be a mixture of two or three or more materials, and is preferably a mixture of lead iodide and cesium iodide or a mixture of lead iodide and cesium bromide; and then, an organic amine solution covers the perovskite skeleton in an existing solution coating manner such as solution spin coating, knife coating, or spray coating, to form a perovskite thin film through reaction. The formed second perovskite layer 1091 can conformally cover peaks and ramp surfaces of the textured structure, and the first perovskite layer 1090 formed by using the solution method can be laminated on and partially fill the bottom of the textured structure. Based on this, the perovskite light absorption layer 109 formed by the foregoing two perovskite layers has advantages of both the solution method and the perovskite skeleton vacuum evaporation method, and also avoids disadvantages of the two methods; and a good light trapping effect and anti-reflection effect of the textured structure are well retained to obtain a high short-circuit current, and a solution component can be conveniently regulated to obtain a required wide band gap and a high open-circuit voltage. It can be learned that, compared with the related art, by using the method for manufacturing a perovskite-silicon-based laminated solar cell provided in this application, a conflict between conformation of the textured structure and regulation of a perovskite component is well balanced, thereby greatly widening a process regulation window and a range of selection of components and materials for preparation of a high-efficiency laminated solar cell.

In addition, when an average vertical distance between lowest ends and highest ends of the textured structure of the first carrier transport layer 108 is L, a range of an average thickness of the first perovskite layer 1090 prepared by using the solution method is greater than 0 and less than or equal to ½L. In this case, the first perovskite layer 1090 prepared by using the solution method is laminated on the bottom of the textured structure of the first carrier transport layer 108, and a thickness of the first perovskite layer is less than or equal to half of a height of the textured structure. Based on this, the formed perovskite light absorption layer 109 can maintain good textured characteristics. To be specific, when the perovskite light absorption layer 109 is subjected to light, the textured structure of the first carrier transport layer can improve photoelectric conversion efficiency by using the light trapping effect and the anti-reflection effect. When the thickness of the first perovskite layer 1090 prepared by using the solution method is greater than half of the height of the textured structure, the formed perovskite light absorption layer 109 has a small part of the height of the textured structure, and has a high reflectivity to light, resulting in low photoelectric conversion efficiency. The thickness of the first perovskite layer 1090 prepared by using the solution method is defined as a height of the solution deposited on the textured structure from a contact point with the textured structure to a highest point of solution lamination in a vertical direction. Therefore, the average thickness of the first perovskite layer 1090 is an average value of the foregoing heights.

Figure 3:
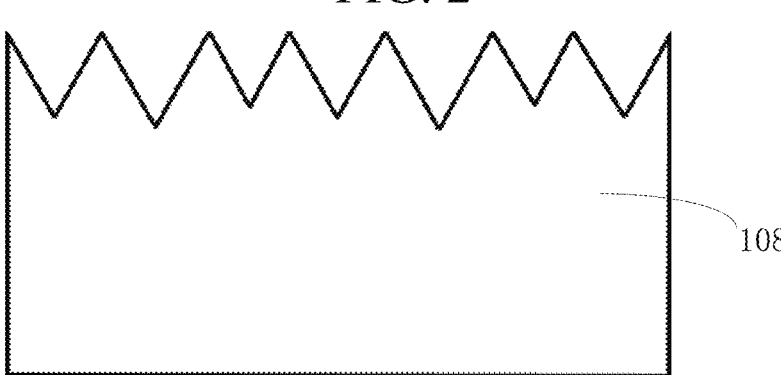
FIG. 3 is a schematic diagram of a first carrier transport layer having a textured structure according to an embodiment of this application.
Figure 4:
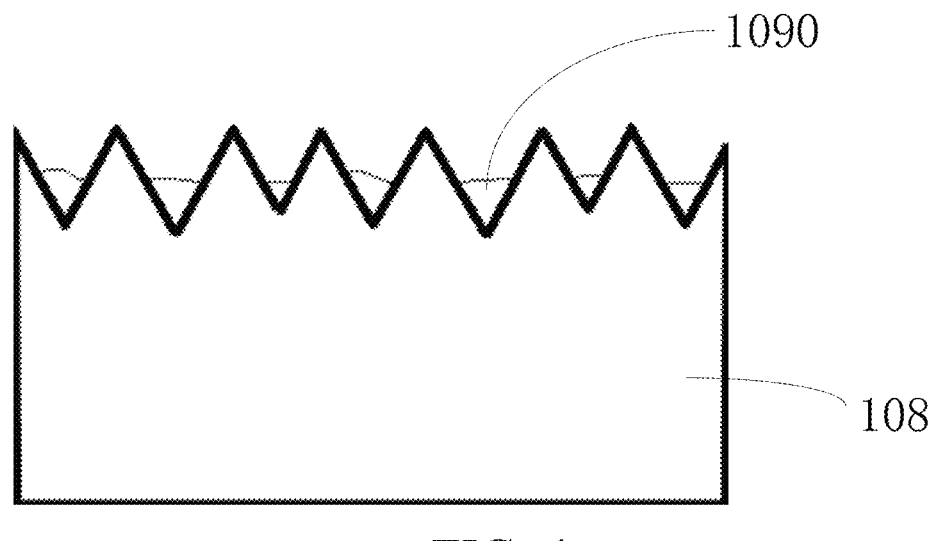
FIG. 4 is a schematic diagram of first preparing a first perovskite layer by using a solution method according to an embodiment of this application.
Figure 5:
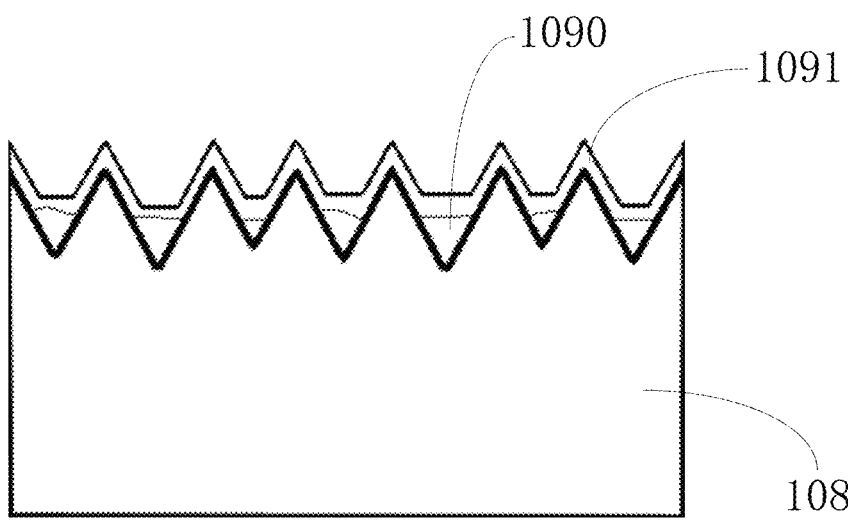
FIG. 5 is a schematic diagram of preparing a second perovskite layer by using a vacuum evaporation method according to an embodiment of this application.

As shown in FIG. 3, FIG. 4, and FIG. 5, in some possible implementations, a two-step method of first using the solution method and then using the perovskite skeleton vacuum evaporation method may be used to prepare the perovskite light absorption layer 109. Specifically, the forming, on the first carrier transport layer 108 having the textured structure, the perovskite light absorption layer 109 formed by a first perovskite layer 1090 and a second perovskite layer 1091 includes: preparing, on the first carrier transport layer 108 having the textured structure, the first perovskite layer 1090 by using the solution method; and preparing the second perovskite layer 1091 by using the perovskite skeleton vacuum evaporation method. Based on this, the first perovskite layer 1090 is first formed on the first carrier transport layer 108 having the textured structure by using the solution method, and then the second perovskite layer 1091 is formed on the first perovskite layer 1090 by using the perovskite skeleton vacuum evaporation method. Based on this, the first perovskite layer 1090 prepared by using the solution method is laminated on the bottom of the textured structure of the first carrier transport layer 108, so that a perovskite band gap can be regulated by changing a component of a perovskite solution; and the second perovskite layer 1091 prepared by using the perovskite skeleton vacuum evaporation method conformally covers the first perovskite layer 1090 and an unfilled part of the textured structure, so that the textured structure is retained to obtain a good light trapping effect and anti-reflection characteristic, and it is also ensured that the textured structure is covered, to avoid a short circuit caused by direct contact between the electrode 113 and the textured structure. The laminated solar cell manufactured by using the method has advantages of existing laminated solar cell schemes, and avoids disadvantages faced in the related art, thereby well balancing the conflict between conformation of the textured structure and regulation of the solution component.

Figure 9:
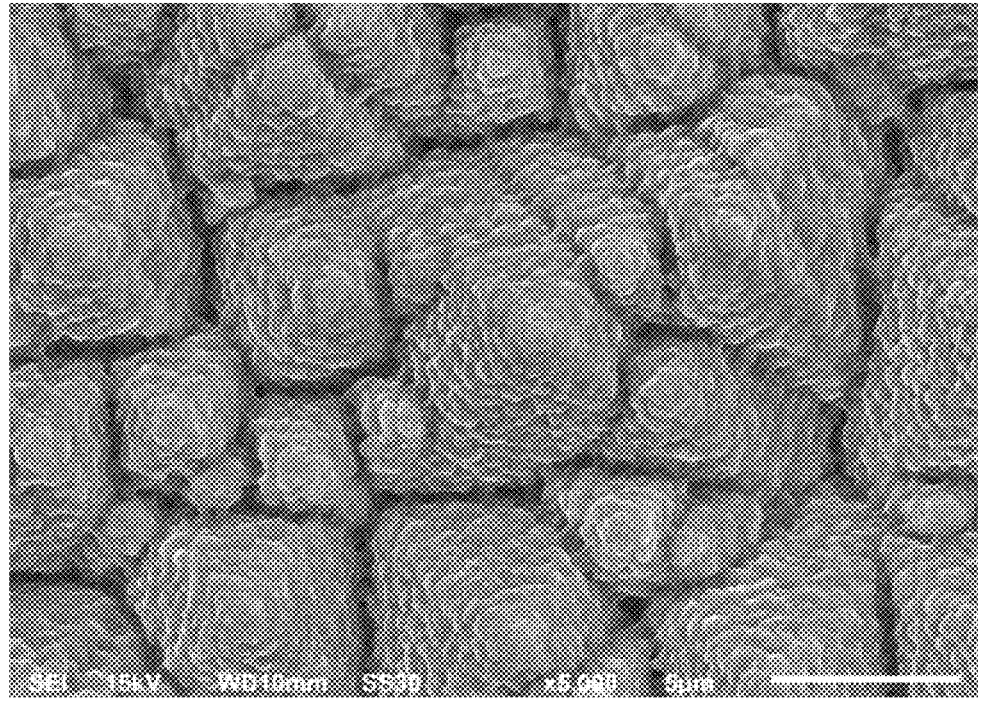
FIG. 9 is a schematic structural diagram of a textured structure of a perovskite-silicon-based laminated solar cell according to an embodiment of this application.

FIG. 9 is a schematic structural diagram of a textured structure of a perovskite-silicon-based laminated solar cell according to an embodiment of this application. As shown in FIG. 9, on a pyramid structure of the textured structure, the second perovskite layer 1091 prepared by using the perovskite skeleton vacuum evaporation method is in a step shape.

Figure 6:
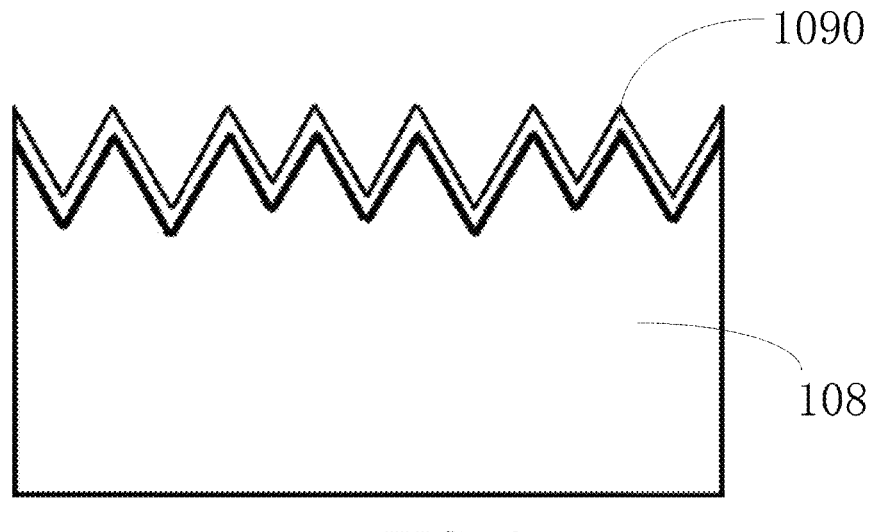
FIG. 6 is a schematic diagram of first preparing a second perovskite layer by using a vacuum evaporation method according to an embodiment of this application.
Figure 7:
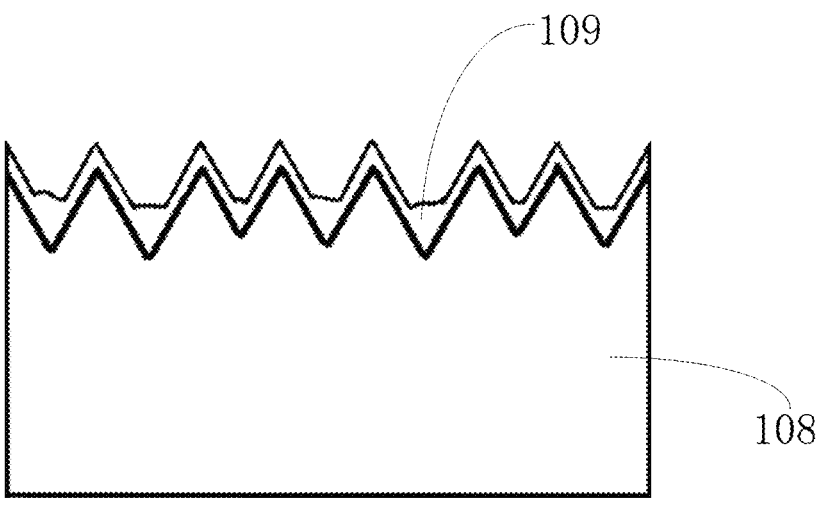
FIG. 7 is a schematic diagram of preparing a first perovskite layer by using a solution method according to an embodiment of this application.

As shown in FIG. 3, FIG. 6, and FIG. 7, in some possible implementations, a two-step method of first using the perovskite skeleton vacuum evaporation method and then using the solution method may be used to prepare the perovskite light absorption layer 109. Specifically, the forming, on the first carrier transport layer 108 having the textured structure, the perovskite light absorption layer 109 formed by a first perovskite layer 1090 and a second perovskite layer 1091 includes: preparing the second perovskite layer 1091 on the first carrier transport layer 108 having the textured structure by using the perovskite skeleton vacuum evaporation method, and preparing the first perovskite layer 1090 by using the solution method. Based on this, the second perovskite layer 1091 is first formed on the first carrier transport layer 108 having the textured structure by using the perovskite skeleton vacuum evaporation method, and then the first perovskite layer 1090 is formed on the second perovskite layer 1091 by using the solution method. Based on this, the second perovskite layer 1091 prepared by using the perovskite skeleton vacuum evaporation method conformally conforms to the textured structure of the first carrier transport layer 108, so that the textured structure is retained to obtain a good light trapping effect and anti-reflection characteristic; and the first perovskite layer 1090 prepared by using the solution method is laminated on the bottom of the textured structure, which is conducive to obtaining a high open-circuit voltage.

In some possible implementations, in the method in which the second perovskite layer 1091 is first prepared by using the perovskite skeleton vacuum evaporation method and then the first perovskite layer 1090 is prepared by using the solution method, the perovskite skeleton may alternatively be first vacuum-evaporated and then the first perovskite layer 1090 and the second perovskite layer 1091 are simultaneously prepared by using a one-step method. Specifically, the forming, on the first carrier transport layer 108 having the textured structure, the perovskite light absorption layer 109 formed by a first perovskite layer 1090 and a second perovskite layer 1091 includes: evaporating a perovskite skeleton on the first carrier transport layer 108 having the textured structure by using the vacuum evaporation method, and preparing the first perovskite layer 1090 by using the solution method, where a solution used in the solution method includes an excess amount of an organic amine; and in a process of forming the first perovskite layer 1090, a material in the perovskite skeleton reacts with the organic amine to form the second perovskite layer 1091. Based on this, when the solution used in the solution method is coated on the perovskite skeleton, the excess amount of the organic amine included in the solution reacts with the perovskite skeleton to form the second perovskite layer 1091. The formed second perovskite layer 1091 conformally covers the textured structure. The first perovskite layer 1090 prepared by using the solution method is deposited on and partially fills the bottom of the textured structure covered by the second perovskite layer 1091, to form the perovskite light absorption layer 109.

In some examples, a solute of the solution used in the solution method is a hybrid perovskite component $Cs_xFA_{y^-}MA_zPbBr_mI_n$ (x+y+z=1, and m+n=3) including Cs or FA or MA, and a solvent of the solution used in the solution method is one or more of N,N-dimethylformamide (DMF) or dimethylsulfoxide (DMSO). In the method in which the perovskite skeleton is first vacuum-evaporated and then the first perovskite layer 1090 and the second perovskite layer 1091 are simultaneously prepared by using the one-step method, the used solution includes lead iodide meeting the foregoing ratio and a mixed component of formamidine hydroiodide, methylamine bromide, and formamidine hydrobromide, and also includes an organic amine component in excess of the foregoing stoichiometric ratio. The excess amount of the organic amine component reacts with the perovskite skeleton to form the second perovskite layer 1091 conformally covering the textured structure.

In some examples, the perovskite skeleton vacuum evaporation method includes: forming the perovskite skeleton through vacuum evaporation, and forming the second perovskite layer 1091 through reaction between the perovskite skeleton and the organic amine, where the perovskite skeleton is a mixture formed by two or three or more of $PbX_2$ or CsY, X and Y each are selected from one or more of a chloride ion ($Cl^-$), a bromide ion ($Br^-$), an iodide ion ($I^-$), or a thiocyanate ion ($SCN^-$), the mixture is preferably a mixture of lead iodide and cesium iodide or a mixture of lead iodide and cesium bromide, and the organic amine is one or more of formamidine hydroiodide, methylamine bromide, or formamidine hydrobromide. A main component of the perovskite skeleton is preferably the mixture of lead iodide ($PbI_2$) and cesium iodide (CsI) or the mixture of lead iodide ($PbI_2$) and cesium bromide (CsBr). During vacuum evaporation of the perovskite skeleton, lead iodide and cesium iodide, or lead iodide and cesium bromide may be jointly vacuum-evaporated as required, to regulate a size of the perovskite band gap to obtain a high open-circuit voltage.

In actual applications, a range of a thickness of the perovskite skeleton is from 50 nm to 1000 nm.

In actual applications, after the organic amine solution is coated on the perovskite skeleton, annealing may be performed at a temperature of 100° C. to 200° C. for 5 min to 30 min, to form the second perovskite layer 1091. When the perovskite skeleton is the mixture of lead iodide ($PbI_2$) and cesium bromide (CsBr), during vacuum evaporation, an evaporation rate of lead iodide may range from 0.1 A/s to 10 A/s, and an evaporation rate of cesium bromide may range from 0.05 A/s to 0.2 A/s. When the organic amine solution is a mixed solution of formamidinium hydroiodide (FAI) and formamidinium hydrobromide (FABr), the solvent may be selected as ethanol or isopropanol.

In some examples, a concentration of the solution used in the solution method ranges from 0.2 mol/L to 3 mol/L. In a process in which the perovskite skeleton is first vacuum-evaporated and then the first perovskite layer 1090 and the second perovskite layer 1091 are simultaneously prepared by using the one-step method, if the concentration of the solution used in the solution method is excessively small, the solvent of the solution used in the solution method may quickly dissolve lead iodide in the perovskite skeleton and throw lead iodide out of the textured structure during coating. As a result, the perovskite skeleton is damaged, and a uniform and continuous perovskite thin film cannot be formed. Preferably, when the concentration of the solution used in the solution method is greater than 1 mol/L, the solvent slowly dissolves lead iodide in perovskite or even has no time to dissolve underlying lead iodide during coating, thereby ensuring conformality of the perovskite thin film on the textured structure. In the method in which the perovskite skeleton is first vacuum-evaporated and then the first perovskite layer 1090 and the second perovskite layer 1091 are prepared simultaneously by using the one-step method, the concentration of the used solution is 0.1 mol/L to 3 mol/L.

In actual applications, the solution used in the solution method may be an N,N-dimethylformamide (DMF)/dimethylsulfoxide (DMSO) (4:1) solution with $Cs_{0.05}FA_{0.8}MA_{0.15}PbBr_{0.6}I_{2.4}$. In the process of preparing the first perovskite layer 1090 by using the solution method, after the solution is coated on the first carrier transport layer 108 having the textured structure by using the solution method, the solution may first achieve surface drying by using a method such as an anti-solvent or air knife blowing, and then annealing may be performed at a temperature of 70° C. to 190° C. for 5 min to 60 min, to form the first perovskite layer 1090. A range of an average thickness of the first perovskite layer 1090 is from 100 nm to 300 nm.

In actual applications, in the method in which the perovskite skeleton is first vacuum-evaporated and then the first perovskite layer 1090 and the second perovskite layer 1091 are prepared simultaneously by using the one-step method, when the perovskite skeleton is the mixture of lead iodide ($PbI_2$) and cesium bromide (CsBr), the solution used in the solution method may be a DMF/DMSO (4:1) solution with a perovskite component ($Cs_{0.05}FA_{0.8}MA_{0.15}PbBr_{0.6}I_{2.4}$) plus an excess amount of formamidinium hydroiodide (FAI) and formamidinium hydrobromide (FABr), where ranges of concentrations of FAI and FABr each may be from 0.1 mol/L to 3 mol/L. In the process of preparing the second perovskite layer 1091 by using the perovskite skeleton vacuum evaporation method, after the solution is first spin-coated on the perovskite skeleton, extraction may be first performed by using anti-solvent (for example, anisole), and then annealing is performed at a temperature of 100° C. to 200° C. for 5 min to 30 min, to finally form the perovskite light absorption layer 109.

In some examples, the perovskite skeleton vacuum evaporation method includes: spin-coating an organic amine solution on the perovskite skeleton, where a rotation speed of spin coating ranges from 500 rpm to 6000 rpm, and a range of a thickness of the perovskite skeleton is from 50 nm to 1000 nm.

In actual applications, a range of a thickness of the second perovskite layer 1091 is from 100 nm to 3000 nm. Because the perovskite light absorption layer 109 is formed by one layer of the first perovskite layer 1090 prepared by using the solution method and one layer of the second perovskite layer 1091 prepared by using the perovskite skeleton vacuum evaporation method, a distance between a contact point above the textured structure of the first carrier transport layer 108 and a highest point covered by the perovskite light absorption layer 109 in the vertical direction is defined as a thickness of the perovskite light absorption layer 109. A range of an average thickness of the perovskite light absorption layer 109 is from 100 nm to 3000 nm.

Figure 8:
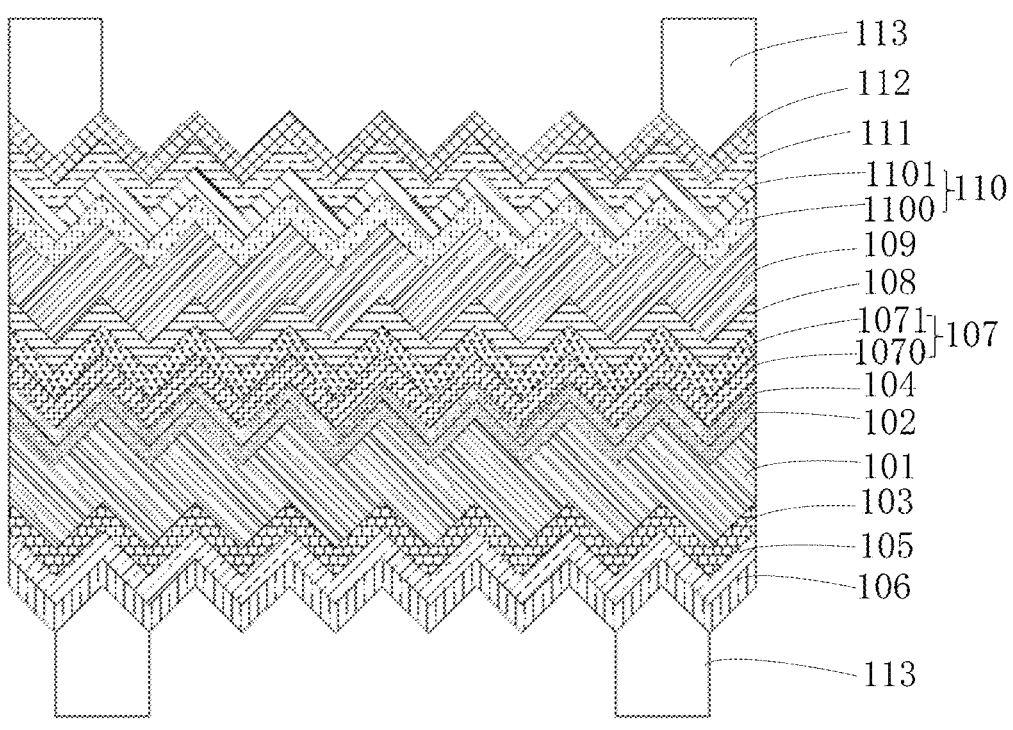
FIG. 8 is a schematic structural diagram of a perovskite-silicon-based laminated solar cell according to an embodiment of this application.

As shown in FIG. 8, a second carrier transport layer 111 is formed on the perovskite light absorption layer 109, to implement vertical transport of photo-generated carriers. A material of the second carrier transport layer 111 may include one or more of $C_{60}$, [6,6]-phenyl-C61-butyric acid methyl ester (PCBM), tin dioxide ($SnO_2$), or titanium dioxide ($TiO_2$), and is not limited thereto.

In actual applications, one layer of LiF, a $C_{60}$ thin film layer, or a PCBM thin film layer may be first prepared on the perovskite light absorption layer 109 by using the vacuum evaporation process, to be used as a second carrier transport interface layer 110; and then the second carrier transport layer 111 with a material of $SnO_2$ or $TiO_2$ is prepared by using a method such as an atomic layer deposition process (ALD), chemical vapor deposition, physical vapor deposition, or a solution coating method. A thickness of the second carrier transport layer 111 may range from 1 nm to 30 nm. It may be understood that, in actual applications, the second carrier transport interface layer 110 may alternatively be omitted.

When the second carrier transport interface layer 110 includes a second carrier transport interface layer 1 1100 and a second carrier transport interface layer 2 1101, the second carrier transport interface layer 1 1100 may be vacuum-evaporated LiF, and the second carrier transport interface layer 2 1101 may be vacuum-evaporated $C_{60}$, where a range of a thickness of LiF is from 0.1 nm to 10 nm, and a range of a thickness of $C_{60}$ is from 1 nm to 20 nm.

As shown in FIG. 8, a second transparent conductive layer 112 is formed on the second carrier transport layer 111, to achieve objectives of laterally transporting electrons to the electrode 113 and reducing optical reflection. A range of a thickness of the second transparent conductive layer 112 may be from 30 nm to 200 nm. For a material of the second transparent conductive layer 112 and a preparation method for the second transparent conductive layer 112, refer to the first transparent conductive layer 106. Details are not described herein again.

The electrode 113 is formed on the first transparent conductive layer 106 and the second transparent conductive layer 112 to collect currents. In actual applications, fine gate lines and main gate lines of the electrode 113 may be manufactured through screen printing or mask evaporation. A material of the electrode 113 may include a metal with good conductivity, such as silver, copper, or aluminum. A range of a thickness of the electrode 113 is from 100 nm to 500 nm.

The method for manufacturing a perovskite-silicon-based laminated solar cell described in this embodiment of this application is not limited to the n-type silicon wafer, and is also applicable to perovskite laminated solar cells integrated with perovskite solar cells, such as a p-type crystalline silicon solar cell, a TOPCON solar cell, a polysilicon solar cell, and a cast monocrystalline silicon solar cell; and is also applicable to other types of perovskite laminated solar cells, including a copper indium gallium selenide-perovskite laminated solar cell, a perovskite-perovskite laminated solar cell, a gallium arsenide-perovskite laminated solar cell, an organic photovoltaic-perovskite laminated solar cell, and the like, which have good versatility and compatibility. In the foregoing method for manufacturing a perovskite-silicon-based laminated solar cell, a first carrier is a hole, and a second carrier is an electron. Therefore, the prepared first carrier transport layer 108 is a hole transport layer, and the second carrier transport layer 111 is an electron transport layer. The method for manufacturing a perovskite-silicon-based laminated solar cell provided in this embodiment of this application is not limited to a trans perovskite top solar cell structure with a hole transport layer as a substrate, and is also applicable to a formal perovskite top solar cell structure with an electron transport layer as a substrate. To be specific, functional layers of a solar cell structure from bottom to top may be a textured silicon-based solar cell, a tunneling junction or a metal oxide recombination layer, an electron transport layer, a first perovskite layer and a second perovskite layer, a hole transport layer, a buffer layer, a metal oxide transparent electrode, and an electrode.

As shown in FIG. 8, an embodiment of this application further provides a perovskite-silicon-based laminated solar cell. The perovskite-silicon-based laminated solar cell is obtained by using the foregoing method for manufacturing a perovskite-silicon-based laminated solar cell.

Beneficial effects of the perovskite-silicon-based laminated solar cell provided in this embodiment of this application are the same as those of the foregoing method for manufacturing a perovskite-silicon-based laminated solar cell.

An embodiment of this application further provides a perovskite-silicon-based laminated solar cell, including a silicon-based bottom solar cell having a textured structure, a charge combination layer, and a first carrier transport layer sequentially laminated, and a perovskite light absorption layer covering the first carrier transport layer having the textured structure, where the perovskite light absorption layer is formed by a first perovskite layer and a second perovskite layer; and the first perovskite layer is prepared by using a solution method, and the second perovskite layer is prepared by using a perovskite skeleton vacuum evaporation method.

In some possible implementations, the first perovskite layer is at least distributed at valleys of the textured structure of the first carrier transport layer, and an average thickness of the first perovskite layer is less than or equal to ½ of a height of the textured structure; and a part of a structure of the second perovskite layer is at least distributed on ramp surfaces and tops of the textured structure, and same textured shapes as the ramp surfaces and the tops are maintained on the ramp surfaces and the tops. The perovskite-silicon-based laminated solar cell formed based on this has good conformality, to retain a good light trapping effect and anti-reflection effect of the textured structure to obtain a high short-circuit current. In addition, manufacturing of the perovskite-silicon-based laminated solar cell is easier to implement compared with direct formation of a conformal perovskite structure, and a solution component can also be conveniently regulated to obtain a required wide band gap and a high open-circuit voltage.

In addition, a layer distributed on the valleys of the textured structure of the first carrier transport layer may also be referred to as the second perovskite layer, and a layer distributed on the ramp surfaces and the tops of the textured structure may also be referred to as the first perovskite layer.

In some possible implementations, a range of a thickness of the first carrier transport layer is from 5 nm to 200 nm, a range of an average thickness of the perovskite light absorption layer is from 100 nm to 3000 nm, and a range of a thickness of the second carrier transport layer is from 1 nm to 30 nm.

In some possible implementations, a range of an average thickness of the first perovskite layer is from 100 nm to 300 nm, and a range of a thickness of the second perovskite layer is from 100 nm to 3000 nm.

To verify performance of the perovskite-silicon-based laminated solar cell manufactured by using the method for manufacturing a perovskite-silicon-based laminated solar cell provided in this embodiment of this application, the following describes in a manner that an embodiment and a comparative example are compared with each other.

Embodiment 1

A method for manufacturing a perovskite-n-type-silicon-based laminated solar cell provided in an embodiment of this application specifically includes the following steps:

Step 1: Provide a commercial-grade n-type silicon wafer with a resistivity of 3 Ω·cm, a thickness of 180 m, and a textured size of 4 m; and sequentially perform texturizing and cleaning on the silicon wafer, to form an n-type monocrystalline silicon substrate having a textured structure.

Step 2: Deposit intrinsic amorphous silicon passivation layers (thickness: 5 nm) on two sides of the n-type monocrystalline silicon substrate by using a PECVD device, to form a first passivation layer located on a front side of the n-type monocrystalline silicon substrate, and a second passivation layer located on a back side of the n-type monocrystalline silicon substrate.

Step 3: Deposit an n-type phosphorus-doped (doping concentration: $10^{20}$ cm$^{-3}$) amorphous silicon layer (thickness: 10 nm) on the first passivation layer by using the PECVD device, to form a front-side emitter electrode.

Step 4: Deposit a p-type boron-doped (doping concentration: $10^{19}$ cm$^{-3}$) amorphous silicon layer (thickness: 10 nm) on the second passivation layer by using the PECVD device, to form a back-field structure.

Step 5: Prepare a first transparent conductive layer (thickness: 100 nm) with a material of ITO on the p-type amorphous silicon layer by using a magnetron sputtering process.

Step 6: Sequentially deposit an n-type doped microcrystalline silicon layer and a p-type doped microcrystalline silicon layer on the n-type amorphous silicon layer by using the PECVD device, to form a tunneling recombination layer (thickness: 8 nm).

Step 7: Prepare a hole transport layer (thickness: 15 nm) with a material of Spiro-TTB on the tunneling recombination layer by using a vacuum evaporation process, where an evaporation rate is 0.2 A/s.

Step 8: Spin-coat, on the hole transport layer having the textured structure, a DMF/DMSO (4:1) solution with a perovskite component ($Cs_{0.05}FA_{0.8}MA_{0.15}PbBr_{0.6}I_{2.4}$) with a concentration of 1.2 mol/L by using a spin coating process, where a rotation speed of spin coating is 2000 rpm; and perform extraction by using anisole, and then perform annealing at 100° C. for 20 min, to form a first perovskite layer (average thickness: 200 nm).

Step 9: Form lead iodide and cesium bromide on the first perovskite layer by using the vacuum evaporation process, where a rate of cesium bromide (CsBr) is 0.1 A/s, a rate of lead iodide ($PbI_2$) is 2 A/s, and a total thickness is 400 nm;

configure a mixed solution of FAI and FABr, where a molar concentration ratio of FAI to FABr is 3:1, and a solvent is ethanol or isopropanol; take 80 μL of the mixed solution of FAI and FABr, spin-coat it on lead iodide and cesium bromide layers, and perform reaction, to form a second perovskite layer (thickness: 550 nm); and perform annealing on the second perovskite layer at 150° C. for 20 min, to form a perovskite light absorption layer (average thickness: 550 nm).

Step 10: Sequentially prepare a LiF thin film layer (thickness: 1 nm) and a $C_{60}$ thin film layer (thickness: 10 nm) on the perovskite light absorption layer by using the vacuum evaporation process, to be used as an electron transport interface layer (thickness: 11 nm).

Step 11: Prepare an electron transport layer (thickness: 10 nm) with a material of $SnO_2$ by using an atomic layer deposition process (ALD).

Step 12: Form a second transparent conductive layer (thickness: 100 nm) with a material of ITO on the electron transport layer by using the magnetron sputtering process.

Step 13: Form a silver electrode on the first transparent conductive layer and the second transparent conductive layer by using a screen printing process.

Embodiment 2

A method for manufacturing a perovskite-n-type-silicon-based laminated solar cell provided in an embodiment of this application specifically includes the following steps:

Step 1: Provide a commercial-grade n-type silicon wafer with a resistivity of 3 Ω·cm, a thickness of 180 m, and a textured size of 4 m; and sequentially perform texturizing and cleaning on the silicon wafer, to form an n-type monocrystalline silicon substrate having a textured structure.

Step 2: Deposit intrinsic amorphous silicon passivation layers (thickness: 5 nm) on two sides of the n-type monocrystalline silicon substrate by using a PECVD device, to form a first passivation layer located on a front side of the n-type monocrystalline silicon substrate, and a second passivation layer located on a back side of the n-type monocrystalline silicon substrate.

Step 3: Deposit an n-type phosphorus-doped (doping concentration: $10^{20}$ $cm^{-3}$) amorphous silicon layer (thickness: 10 nm) on the first passivation layer by using the PECVD device, to form a front-side emitter electrode.

Step 4: Deposit a p-type boron-doped (doping concentration: $10^{19}$ $cm^{-3}$) amorphous silicon layer (thickness: 10 nm) on the second passivation layer by using the PECVD device, to form a back-field structure.

Step 5: Prepare a first transparent conductive layer (thickness: 100 nm) with a material of ITO on the p-type amorphous silicon layer by using a magnetron sputtering process.

Step 6: Sequentially deposit an n-type doped microcrystalline silicon layer and a p-type doped microcrystalline silicon layer on the n-type amorphous silicon layer by using the PECVD device, to form a tunneling recombination layer (thickness: 8 nm).

Step 7: Prepare a hole transport layer (thickness: 15 nm) with a material of Spiro-TTB on the tunneling recombination layer by using a vacuum evaporation process, where an evaporation rate is 0.2 A/s.

Step 8: Spin-coat, on the hole transport layer having the textured structure, a DMF/DMSO (4:1) solution with a perovskite component ($Cs_{0.05}FA_{0.8}MA_{0.15}PbBr_{0.6}I_{2.4}$) with a concentration of 0.2 mol/L by using a spin coating process, where a rotation speed of spin coating is 500 rpm; and perform extraction by using anisole, and then perform annealing at 70° C. for 60 min, to form a first perovskite layer (average thickness: 100 nm).

Step 9: Form lead iodide and cesium bromide on the first perovskite layer by using the vacuum evaporation process, where a rate of cesium bromide (CsBr) is 0.05 A/s, a rate of lead iodide ($PbI_2$) is 0.1 A/s, and a total thickness is 50 nm;

configure a mixed solution of FAI and FABr, where a molar concentration ratio of FAI to FABr is 3:1, and a solvent is ethanol or isopropanol; take 70 μL of the mixed solution of FAI and FABr, spin-coat it on lead iodide and cesium bromide layers, and perform reaction, to form a second perovskite layer (thickness: 100 nm); and perform annealing on the second perovskite layer at 100° C. for 30 min, to form a perovskite light absorption layer (average thickness: 100 nm).

Step 10: Sequentially prepare a LiF thin film layer (thickness: 1 nm) and a $C_{60}$ thin film layer (thickness: 10 nm) on the perovskite light absorption layer by using the vacuum evaporation process, to be used as an electron transport interface layer (thickness: 11 nm).

Step 11: Prepare an electron transport layer (thickness: 10 nm) with a material of $SnO_2$ by using an atomic layer deposition process (ALD).

Step 12: Form a second transparent conductive layer (thickness: 100 nm) with a material of ITO on the electron transport layer by using the magnetron sputtering process.

Step 13: Form a silver electrode on the first transparent conductive layer and the second transparent conductive layer by using a screen printing process.

Embodiment 3

A method for manufacturing a perovskite-n-type-silicon-based laminated solar cell provided in an embodiment of this application specifically includes the following steps:

Step 1: Provide a commercial-grade n-type silicon wafer with a resistivity of 3 Ω·cm, a thickness of 180 m, and a textured size of 4 m; and sequentially perform texturizing and cleaning on the silicon wafer, to form an n-type monocrystalline silicon substrate having a textured structure.

Step 2: Deposit intrinsic amorphous silicon passivation layers (thickness: 5 nm) on two sides of the n-type monocrystalline silicon substrate by using a PECVD device, to form a first passivation layer located on a front side of the n-type monocrystalline silicon substrate, and a second passivation layer located on a back side of the n-type monocrystalline silicon substrate.

Step 3: Deposit an n-type phosphorus-doped (doping concentration: $10^{20}$ $cm^{-3}$) amorphous silicon layer (thickness: 10 nm) on the first passivation layer by using the PECVD device, to form a front-side emitter electrode.

Step 4: Deposit a p-type boron-doped (doping concentration: $10^{19}$ $cm^{-3}$) amorphous silicon layer (thickness: 10 nm) on the second passivation layer by using the PECVD device, to form a back-field structure.

Step 5: Prepare a first transparent conductive layer (thickness: 100 nm) with a material of ITO on the p-type amorphous silicon layer by using a magnetron sputtering process.

Step 6: Sequentially deposit an n-type doped microcrystalline silicon layer and a p-type doped microcrystalline silicon layer on the n-type amorphous silicon layer by using the PECVD device, to form a tunneling recombination layer (thickness: 8 nm).

Step 7: Prepare a hole transport layer (thickness: 15 nm) with a material of Spiro-TTB on the tunneling recombination layer by using a vacuum evaporation process, where an evaporation rate is 0.2 A/s.

Step 8: Spin-coat, on the hole transport layer having the textured structure, a DMF/DMSO (4:1) solution with a perovskite component ($Cs_{0.05}FA_{0.8}MA_{0.15}PbBr_{0.6}I_{2.4}$) with a concentration of 3 mol/L by using a spin coating process, where a rotation speed of spin coating is 6000 rpm; and perform extraction by using anisole, and then perform annealing at 190° C. for 5 min, to form a first perovskite layer (average thickness: 300 nm).

Step 9: Form lead iodide and cesium bromide on the first perovskite layer by using the vacuum evaporation process, where a rate of cesium bromide (CsBr) is 0.2 A/s, a rate of lead iodide ($PbI_2$) is 10 A/s, and a total thickness is 1000 nm;

configure a mixed solution of FAI and FABr, where a molar concentration ratio of FAI to FABr is 3:1, and a solvent is ethanol or isopropanol; take 90 μL of the mixed solution of FAI and FABr, spin-coat it on lead iodide and cesium bromide layers, and perform reaction, to form a second perovskite layer (thickness: 3000 nm); and perform annealing on the second perovskite layer at 200° C. for 5 min, to form a perovskite light absorption layer (average thickness: 3000 nm).

Step 10: Sequentially prepare a LiF thin film layer (thickness: 1 nm) and a $C_{60}$ thin film layer (thickness: 10 nm) on the perovskite light absorption layer by using the vacuum evaporation process, to be used as an electron transport interface layer (thickness: 11 nm).

Step 11: Prepare an electron transport layer (thickness: 10 nm) with a material of $SnO_2$ by using an atomic layer deposition process (ALD).

Step 12: Form a second transparent conductive layer (thickness: 100 nm) with a material of ITO on the electron transport layer by using the magnetron sputtering process.

Step 13: Form a silver electrode on the first transparent conductive layer and the second transparent conductive layer by using a screen printing process.

Embodiment 4

A method for manufacturing a perovskite-n-type-silicon-based laminated solar cell provided in an embodiment of this application specifically includes the following steps:

Step 1: Provide a commercial-grade n-type silicon wafer with a resistivity of 3 Ω·cm, a thickness of 180 m, and a textured size of 4 m; and sequentially perform texturizing and cleaning on the silicon wafer, to form an n-type monocrystalline silicon substrate having a textured structure.

Step 2: Deposit intrinsic amorphous silicon passivation layers (thickness: 5 nm) on two sides of the n-type monocrystalline silicon substrate by using a PECVD device, to form a first passivation layer located on a front side of the n-type monocrystalline silicon substrate, and a second passivation layer located on a back side of the n-type monocrystalline silicon substrate.

Step 3: Deposit an n-type phosphorus-doped (doping concentration: $10^{20}$ $cm^3$) amorphous silicon layer (thickness: 10 nm) on the first passivation layer by using the PECVD device, to form a front-side emitter electrode.

Step 4: Deposit a p-type boron-doped (doping concentration: $10^{19}$ $cm^{-3}$) amorphous silicon layer (thickness: 10 nm) on the second passivation layer by using the PECVD device, to form a back-field structure.

Step 5: Prepare a first transparent conductive layer (thickness: 100 nm) with a material of ITO on the p-type amorphous silicon layer by using a magnetron sputtering process.

Step 6: Sequentially deposit an n-type doped microcrystalline silicon layer and a p-type doped microcrystalline silicon layer on the n-type amorphous silicon layer by using the PECVD device, to form a tunneling recombination layer (thickness: 8 nm).

Step 7: Prepare a hole transport layer (thickness: 15 nm) with a material of Spiro-TTB on the tunneling recombination layer by using a vacuum evaporation process, where an evaporation rate is 0.2 A/s.

Step 8: Form lead iodide and cesium bromide on the hole transport layer by using the vacuum evaporation process, where a rate of cesium bromide (CsBr) is 0.1 A/s, a rate of lead iodide ($PbI_2$) is 2 A/s, and a total thickness is 400 nm.

Step 9: Spin-coat, on the hole transport layer having the textured structure, a DMF/DMSO (4:1) solution with a perovskite component ($Cs_{0.05}FA_{0.8}MA_{0.15}PbBr_{0.6}I_{2.4}$), FAI, and FABr by using a spin coating process, where a concentration of the perovskite component is 1.2 mol/L, a concentration of FAI is 0.5 mol/L, a concentration of FABr is 0.1 mol/L, a rotation speed of spin coating is 2000 rpm; and perform extraction by using anisole, and then perform annealing at 120° C. for 20 min, to form a perovskite light absorption layer (average thickness: 550 nm).

Step 10: Sequentially prepare a LiF thin film layer (thickness: 1 nm) and a $C_{60}$ thin film layer (thickness: 10 nm) on the perovskite light absorption layer by using the vacuum evaporation process, to be used as an electron transport interface layer (thickness: 11 nm).

Step 11: Prepare an electron transport layer (thickness: 10 nm) with a material of $SnO_2$ by using an atomic layer deposition process (ALD).

Step 12: Form a second transparent conductive layer (thickness: 100 nm) with a material of ITO on the electron transport layer by using the magnetron sputtering process.

Step 13: Form a silver electrode on the first transparent conductive layer and the second transparent conductive layer by using a screen printing process.

Embodiment 5

A method for manufacturing a perovskite-n-type-silicon-based laminated solar cell provided in an embodiment of this application specifically includes the following steps:

Step 1: Provide a commercial-grade n-type silicon wafer with a resistivity of 3 Ω·cm, a thickness of 180 m, and a textured size of 4 m; and sequentially perform texturizing and cleaning on the silicon wafer, to form an n-type monocrystalline silicon substrate having a textured structure.

Step 2: Deposit intrinsic amorphous silicon passivation layers (thickness: 5 nm) on two sides of the n-type monocrystalline silicon substrate by using a PECVD device, to form a first passivation layer located on a front side of the n-type monocrystalline silicon substrate, and a second passivation layer located on a back side of the n-type monocrystalline silicon substrate.

Step 3: Deposit an n-type phosphorus-doped (doping concentration: $10^{20}$ $cm^{-3}$) amorphous silicon layer (thickness: 10 nm) on the first passivation layer by using the PECVD device, to form a front-side emitter electrode.

Step 4: Deposit a p-type boron-doped (doping concentration: $10^{19}$ cm$^{-3}$) amorphous silicon layer (thickness: 10 nm) on the second passivation layer by using the PECVD device, to form a back-field structure.

Step 5: Prepare a first transparent conductive layer (thickness: 100 nm) with a material of ITO on the p-type amorphous silicon layer by using a magnetron sputtering process.

Step 6: Sequentially deposit an n-type doped microcrystalline silicon layer and a p-type doped microcrystalline silicon layer on the n-type amorphous silicon layer by using the PECVD device, to form a tunneling recombination layer (thickness: 8 nm).

Step 7: Prepare a hole transport layer (thickness: 15 nm) with a material of Spiro-TTB on the tunneling recombination layer by using a vacuum evaporation process, where an evaporation rate is 0.2 A/s.

Step 8: Form lead iodide and cesium bromide on the hole transport layer by using the vacuum evaporation process, where a rate of cesium bromide (CsBr) is 0.05 A/s, a rate of lead iodide (PbI$_2$) is 0.1 A/s, and a total thickness is 50 nm.

Step 9: Spin-coat, on the hole transport layer having the textured structure, a DMF/DMSO (4:1) solution with a perovskite component (Cs$_{0.05}$FA$_{0.8}$MA$_{0.15}$PbBr$_{0.6}$I$_{2.4}$), FAI, and FABr by using a spin coating process, where a concentration of the perovskite component is 0.1 mol/L, a concentration of FAI is 0.1 mol/L, a concentration of FABr is 0.5 mol/L, a rotation speed of spin coating is 500 rpm; and perform extraction by using anisole, and then perform annealing at 100° C. for 30 min, to form a perovskite light absorption layer (average thickness: 100 nm).

Step 10: Sequentially prepare a LiF thin film layer (thickness: 1 nm) and a C$_{60}$ thin film layer (thickness: 10 nm) on the perovskite light absorption layer by using the vacuum evaporation process, to be used as an electron transport interface layer (thickness: 11 nm).

Step 11: Prepare an electron transport layer (thickness: 10 nm) with a material of SnO$_2$ by using an atomic layer deposition process (ALD).

Step 12: Form a second transparent conductive layer (thickness: 100 nm) with a material of ITO on the electron transport layer by using the magnetron sputtering process.

Step 13: Form a silver electrode on the first transparent conductive layer and the second transparent conductive layer by using a screen printing process.

Embodiment 6

A method for manufacturing a perovskite-n-type-silicon-based laminated solar cell provided in an embodiment of this application specifically includes the following steps:

Step 1: Provide a commercial-grade n-type silicon wafer with a resistivity of 3 Ω·cm, a thickness of 180 m, and a textured size of 4 m; and sequentially perform texturizing and cleaning on the silicon wafer, to form an n-type monocrystalline silicon substrate having a textured structure.

Step 2: Deposit intrinsic amorphous silicon passivation layers (thickness: 5 nm) on two sides of the n-type monocrystalline silicon substrate by using a PECVD device, to form a first passivation layer located on a front side of the n-type monocrystalline silicon substrate, and a second passivation layer located on a back side of the n-type monocrystalline silicon substrate.

Step 3: Deposit an n-type phosphorus-doped (doping concentration: $10^{20}$ cm$^{-3}$) amorphous silicon layer (thickness: 10 nm) on the first passivation layer by using the PECVD device, to form a front-side emitter electrode.

Step 4: Deposit a p-type boron-doped (doping concentration: $10^{19}$ cm$^{-3}$) amorphous silicon layer (thickness: 10 nm) on the second passivation layer by using the PECVD device, to form a back-field structure.

Step 5: Prepare a first transparent conductive layer (thickness: 100 nm) with a material of ITO on the p-type amorphous silicon layer by using a magnetron sputtering process.

Step 6: Sequentially deposit an n-type doped microcrystalline silicon layer and a p-type doped microcrystalline silicon layer on the n-type amorphous silicon layer by using the PECVD device, to form a tunneling recombination layer (thickness: 8 nm).

Step 7: Prepare a hole transport layer (thickness: 15 nm) with a material of Spiro-TTB on the tunneling recombination layer by using a vacuum evaporation process, where an evaporation rate is 0.2 A/s.

Step 8: Form lead iodide and cesium bromide on the hole transport layer by using the vacuum evaporation process, where a rate of cesium bromide (CsBr) is 0.2 A/s, a rate of lead iodide (PbI$_2$) is 10 A/s, and a total thickness is 1000 nm.

Step 9: Spin-coat, on the hole transport layer having the textured structure, a DMF/DMSO (4:1) solution with a perovskite component (Cs$_{0.05}$FA$_{0.8}$MA$_{0.15}$PbBr$_{0.6}$I$_{2.4}$), FAI, and FABr by using a spin coating process, where a concentration of the perovskite component is 3 mol/L, a concentration of FAI is 3 mol/L, a concentration of FABr is 3 mol/L, a rotation speed of spin coating is 6000 rpm; and perform extraction by using anisole, and then perform annealing at 200° C. for 5 min, to form a perovskite light absorption layer (average thickness: 3000 nm).

Step 10: Sequentially prepare a LiF thin film layer (thickness: 1 nm) and a C$_{60}$ thin film layer (thickness: 10 nm) on the perovskite light absorption layer by using the vacuum evaporation process, to be used as an electron transport interface layer (thickness: 11 nm).

Step 11: Prepare an electron transport layer (thickness: 10 nm) with a material of SnO$_2$ by using an atomic layer deposition process (ALD).

Step 12: Form a second transparent conductive layer (thickness: 100 nm) with a material of ITO on the electron transport layer by using the magnetron sputtering process.

Step 13: Form a silver electrode on the first transparent conductive layer and the second transparent conductive layer by using a screen printing process.

Embodiment 7

A method for manufacturing a perovskite-n-type-silicon-based laminated solar cell provided in an embodiment of this application specifically includes the following steps:

Step 1: Provide a commercial-grade n-type silicon wafer with a resistivity of 3 Ω·cm, a thickness of 180 m, and a textured size of 4 m; and sequentially perform texturizing and cleaning on the silicon wafer, to form an n-type monocrystalline silicon substrate having a textured structure.

Step 2: Deposit intrinsic amorphous silicon passivation layers (thickness: 5 nm) on two sides of the n-type monocrystalline silicon substrate by using a PECVD device, to form a first passivation layer located on a front side of the n-type monocrystalline silicon substrate, and a second passivation layer located on a back side of the n-type monocrystalline silicon substrate.

Step 3: Deposit an n-type phosphorus-doped (doping concentration: $10^{20}$ cm$^3$) amorphous silicon layer (thickness: 10 nm) on the first passivation layer by using the PECVD device, to form a front-side emitter electrode.

Step 4: Deposit a p-type boron-doped (doping concentration: $10^{19}$ cm$^{-3}$) amorphous silicon layer (thickness: 10 nm) on the second passivation layer by using the PECVD device, to form a back-field structure.

Step 5: Prepare a first transparent conductive layer (thickness: 100 nm) with a material of ITO on the p-type amorphous silicon layer by using a magnetron sputtering process.

Step 6: Sequentially deposit an n-type doped microcrystalline silicon layer and a p-type doped microcrystalline silicon layer on the n-type amorphous silicon layer by using the PECVD device, to form a tunneling recombination layer (thickness: 8 nm).

Step 7: Prepare a hole transport layer (thickness: 15 nm) with a material of Spiro-TTB on the tunneling recombination layer by using a vacuum evaporation process, where an evaporation rate is 0.2 A/s.

Step 8: Form lead iodide and cesium bromide on the hole transport layer by using the vacuum evaporation process, where a rate of cesium bromide (CsBr) is 0.05 A/s, a rate of lead iodide (PbI$_2$) is 0.1 A/s, and a total thickness is 50 nm.

configure a mixed solution of FAI and FABr, where a molar concentration ratio of FAI to FABr is 3:1, and a solvent is ethanol or isopropanol; take 90 µL of the mixed solution of FAI and FABr, spin-coat it on lead iodide and cesium bromide layers, and perform reaction; and then perform annealing on the first perovskite layer at 100° C. for 30 min, to form a first perovskite layer (average thickness: 100 nm).

Step 9: Spin-coat, on the hole transport layer having the textured structure, a DMF/DMSO (4:1) solution with a perovskite component (Cs$_{0.05}$FA$_{0.8}$MA$_{0.15}$PbBr$_{0.6}$I$_{2.4}$) by using a spin coating process, where a concentration of the perovskite component is 0.1 mol/L, a rotation speed of spin coating is 500 rpm; and perform extraction by using anisole, and then perform annealing at 70° C. for 60 min, to form a perovskite light absorption layer (average thickness: 100 nm).

Step 10: Sequentially prepare a LiF thin film layer (thickness: 1 nm) and a C$_{60}$ thin film layer (thickness: 10 nm) on the perovskite light absorption layer by using the vacuum evaporation process, to be used as an electron transport interface layer (thickness: 11 nm).

Step 11: Prepare an electron transport layer (thickness: 10 nm) with a material of SnO$_2$ by using an atomic layer deposition process (ALD).

Step 12: Form a second transparent conductive layer (thickness: 100 nm) with a material of ITO on the electron transport layer by using the magnetron sputtering process.

Step 13: Form a silver electrode on the first transparent conductive layer and the second transparent conductive layer by using a screen printing process.

Embodiment 8

A method for manufacturing a perovskite-n-type-silicon-based laminated solar cell provided in an embodiment of this application specifically includes the following steps:

Step 1: Provide a commercial-grade n-type silicon wafer with a resistivity of 3 Ω·cm, a thickness of 180 m, and a textured size of 4 m; and sequentially perform texturizing and cleaning on the silicon wafer, to form an n-type monocrystalline silicon substrate having a textured structure.

Step 2: Deposit intrinsic amorphous silicon passivation layers (thickness: 5 nm) on two sides of the n-type monocrystalline silicon substrate by using a PECVD device, to form a first passivation layer located on a front side of the n-type monocrystalline silicon substrate, and a second passivation layer located on a back side of the n-type monocrystalline silicon substrate.

Step 3: Deposit an n-type phosphorus-doped (doping concentration: $10^{20}$ cm$^{-3}$) amorphous silicon layer (thickness: 10 nm) on the first passivation layer by using the PECVD device, to form a front-side emitter electrode.

Step 4: Deposit a p-type boron-doped (doping concentration: $10^{19}$ cm$^{-3}$) amorphous silicon layer (thickness: 10 nm) on the second passivation layer by using the PECVD device, to form a back-field structure.

Step 5: Prepare a first transparent conductive layer (thickness: 100 nm) with a material of ITO on the p-type amorphous silicon layer by using a magnetron sputtering process.

Step 6: Sequentially deposit an n-type doped microcrystalline silicon layer and a p-type doped microcrystalline silicon layer on the n-type amorphous silicon layer by using the PECVD device, to form a tunneling recombination layer (thickness: 8 nm).

Step 7: Prepare an electron transport layer (thickness: 15 nm) with a material of C$_{60}$ on the tunneling recombination layer by using a vacuum evaporation process, where an evaporation rate is 0.2 A/s.

Step 8: Form lead iodide and cesium bromide on the electron transport layer by using the vacuum evaporation process, where a rate of cesium bromide (CsBr) is 0.2 A/s, a rate of lead iodide (PbI$_2$) is 10 A/s, and a total thickness is 1000 nm;

configure a mixed solution of FAI and FABr, where a molar concentration ratio of FAI to FABr is 3:1, and a solvent is ethanol or isopropanol; take 90 µL of the mixed solution of FAI and FABr, spin-coat it on lead iodide and cesium bromide layers, and perform reaction; and then perform annealing on the first perovskite layer at 200° C. for 5 min, to form a first perovskite layer (average thickness: 300 nm).

Step 9: Spin-coat, on the electron transport layer having the textured structure, a DMF/DMSO (4:1) solution with a perovskite component (Cs$_{0.05}$FA$_{0.8}$MA$_{0.15}$PbBr$_{0.6}$I$_{2.4}$) by using a spin coating process, where a concentration of the perovskite component is 3 mol/L, a rotation speed of spin coating is 6000 rpm; and perform extraction by using anisole, and then perform annealing at 190° C. for 5 min, to form a perovskite light absorption layer (average thickness: 300 nm).

Step 10: Evaporate a hole transport layer (thickness: 10 nm) with a material of Spiro-TTB on the perovskite light absorption layer by using the vacuum evaporation process, where an evaporation rate is 0.1 A/s.

Step 11: Prepare a buffer layer (thickness: 10 nm) with a material of NiOx by using an atomic layer deposition process (ALD).

Step 12: Form a second transparent conductive layer (thickness: 100 nm) with a material of ITO on the hole transport layer by using the magnetron sputtering process.

Step 13: Form a silver electrode on the first transparent conductive layer and the second transparent conductive layer by using a screen printing process.

Embodiment 9

A method for manufacturing a perovskite-n-type-silicon-based laminated solar cell provided in an embodiment of this application specifically includes the following steps:

Step 1: Provide a commercial-grade n-type silicon wafer with a resistivity of 3 Ω·cm, a thickness of 180 m, and a textured size of 4 m; and sequentially perform texturizing and cleaning on the silicon wafer, to form an n-type monocrystalline silicon substrate having a textured structure.

Step 2: Deposit intrinsic amorphous silicon passivation layers (thickness: 5 nm) on two sides of the n-type monocrystalline silicon substrate by using a PECVD device, to form a first passivation layer located on a front side of the n-type monocrystalline silicon substrate, and a second passivation layer located on a back side of the n-type monocrystalline silicon substrate.

Step 3: Deposit an n-type phosphorus-doped (doping concentration: $10^{20}$ $cm^3$) amorphous silicon layer (thickness: 10 nm) on the first passivation layer by using the PECVD device, to form a front-side emitter electrode.

Step 4: Deposit a p-type boron-doped (doping concentration: $10^{19}$ $cm^{-3}$) amorphous silicon layer (thickness: 10 nm) on the second passivation layer by using the PECVD device, to form a back-field structure.

Step 5: Prepare a first transparent conductive layer (thickness: 100 nm) with a material of ITO on the p-type amorphous silicon layer by using a magnetron sputtering process.

Step 6: Sequentially deposit an n-type doped microcrystalline silicon layer and a p-type doped microcrystalline silicon layer on the n-type amorphous silicon layer by using the PECVD device, to form a tunneling recombination layer (thickness: 8 nm).

Step 7: Prepare an electron transport layer (thickness: 15 nm) with a material of $C_{60}$ on the tunneling recombination layer by using a vacuum evaporation process, where an evaporation rate is 0.2 A/s.

Step 8: Form lead iodide and cesium bromide on the electron transport layer by using the vacuum evaporation process, where a rate of cesium bromide (CsBr) is 0.1 A/s, a rate of lead iodide (PbI$_2$) is 5 A/s, and a total thickness is 500 nm;

configure a mixed solution of FAI and FABr, where a molar concentration ratio of FAI to FABr is 3:1, and a solvent is ethanol or isopropanol; take 90 µL of the mixed solution of FAI and FABr, spin-coat it on lead iodide and cesium bromide layers, and perform reaction; and then perform annealing on the first perovskite layer at 150° C. for 20 min, to form a first perovskite layer (average thickness: 200 nm).

Step 9: Spin-coat, on the electron transport layer having the textured structure, a DMF/DMSO (4:1) solution with a perovskite component $(Cs_{0.05}FA_{0.8}MA_{0.15}PbBr_{0.6}I_{2.4})$ by using a spin coating process, where a concentration of the perovskite component is 1.5 mol/L, a rotation speed of spin coating is 3000 rpm; and perform extraction by using anisole, and then perform annealing at 130° C. for 30 min, to form a perovskite light absorption layer (average thickness: 3000 nm).

Step 10: Evaporate a hole transport layer (thickness: 10 nm) with a material of Spiro-TTB on the perovskite light absorption layer by using the vacuum evaporation process, where an evaporation rate is 0.1 A/s.

Step 11: Prepare a buffer layer (thickness: 10 nm) with a material of NiOx by using an atomic layer deposition process (ALD).

Step 12: Form a second transparent conductive layer (thickness: 100 nm) with a material of ITO on the hole transport layer by using the magnetron sputtering process.

Step 13: Form a silver electrode on the first transparent conductive layer and the second transparent conductive layer by using a screen printing process.

Comparative Example 1

A method for manufacturing a perovskite-n-type-silicon-based laminated solar cell provided in an embodiment of this application specifically includes the following steps:

Step 1: Provide a commercial-grade n-type silicon wafer with a resistivity of 3 Ω·cm, a thickness of 180 m, and a textured size of 4 m; and sequentially perform texturizing and cleaning on the silicon wafer, to form an n-type monocrystalline silicon substrate having a textured structure.

Step 2: Deposit intrinsic amorphous silicon passivation layers (thickness: 5 nm) on two sides of the n-type monocrystalline silicon substrate by using a PECVD device, to form a first passivation layer located on a front side of the n-type monocrystalline silicon substrate, and a second passivation layer located on a back side of the n-type monocrystalline silicon substrate.

Step 3: Deposit an n-type phosphorus-doped (doping concentration: $10^{20}$ $cm^{-3}$) amorphous silicon layer (thickness: 10 nm) on the first passivation layer by using the PECVD device, to form a front-side emitter electrode.

Step 4: Deposit a p-type boron-doped (doping concentration: $10^{19}$ $cm^{-3}$) amorphous silicon layer (thickness: 10 nm) on the second passivation layer by using the PECVD device, to form a back-field structure.

Step 5: Prepare a first transparent conductive layer (thickness: 100 nm) with a material of ITO on the p-type amorphous silicon layer by using a magnetron sputtering process.

Step 6: Sequentially deposit an n-type doped microcrystalline silicon layer and a p-type doped microcrystalline silicon layer on the n-type amorphous silicon layer by using the PECVD device, to form a tunneling recombination layer (thickness: 8 nm).

Step 7: Prepare a hole transport layer (thickness: 15 nm) with a material of Spiro-TTB on the tunneling recombination layer by using a vacuum evaporation process, where an evaporation rate is 0.2 A/s.

Step 8: Form lead iodide and cesium bromide on the hole transport layer by using the vacuum evaporation process, where a rate of cesium bromide (CsBr) is 0.1 A/s, a rate of lead iodide (PbI$_2$) is 2 A/s, and a total thickness is 400 nm;

configure a mixed solution of FAI and FABr, where a molar concentration ratio of FAI to FABr is 3:1, and a solvent is ethanol or isopropanol; take 80 μL of the mixed solution of FAI and FABr, spin-coat it on lead iodide and cesium bromide layers, and perform reaction, to form a perovskite thin film (thickness: 550 nm); and perform annealing on the perovskite thin film at 150° C. for 20 min, to form a perovskite light absorption layer (average thickness: 550 nm).

Step 9: Sequentially prepare a LiF thin film layer (thickness: 1 nm) and a C$_{60}$ thin film layer (thickness: 10 nm) on the perovskite light absorption layer by using the vacuum evaporation process, to be used as an electron transport interface layer (thickness: 11 nm).

Step 10: Prepare an electron transport layer (thickness: 10 nm) with a material of SnO$_2$ by using an atomic layer deposition process (ALD).

Step 11: Form a second transparent conductive layer (thickness: 100 nm) with a material of ITO on the electron transport layer by using the magnetron sputtering process.

Step 12: Form a silver electrode on the first transparent conductive layer and the second transparent conductive layer by using a screen printing process.

Comparative Example 2

A method for manufacturing a perovskite-n-type-silicon-based laminated solar cell provided in an embodiment of this application specifically includes the following steps:

Step 1: Provide a commercial-grade n-type silicon wafer with a resistivity of 3 Ω·cm, a thickness of 180 m, and a textured size of 4 m; and sequentially perform texturizing and cleaning on the silicon wafer, to form an n-type monocrystalline silicon substrate having a textured structure.

Step 2: Deposit intrinsic amorphous silicon passivation layers (thickness: 5 nm) on two sides of the n-type monocrystalline silicon substrate by using a PECVD device, to form a first passivation layer located on a front side of the n-type monocrystalline silicon substrate, and a second passivation layer located on a back side of the n-type monocrystalline silicon substrate.

Step 3: Deposit an n-type phosphorus-doped (doping concentration: 10$^{20}$ cm$^{-3}$) amorphous silicon layer (thickness: 10 nm) on the first passivation layer by using the PECVD device, to form a front-side emitter electrode.

Step 4: Deposit a p-type boron-doped (doping concentration: 10$^{19}$ cm$^{-3}$) amorphous silicon layer (thickness: 10 nm) on the second passivation layer by using the PECVD device, to form a back-field structure.

Step 5: Prepare a first transparent conductive layer (thickness: 100 nm) with a material of ITO on the p-type amorphous silicon layer by using a magnetron sputtering process.

Step 6: Sequentially deposit an n-type doped microcrystalline silicon layer and a p-type doped microcrystalline silicon layer on the n-type amorphous silicon layer by using the PECVD device, to form a tunneling recombination layer (thickness: 8 nm).

Step 7: Prepare a hole transport layer (thickness: 15 nm) with a material of Spiro-TTB on the tunneling recombination layer by using a vacuum evaporation process, where an evaporation rate is 0.2 A/s.

Step 8: Spin-coat, on the hole transport layer having the textured structure, a DMF/DMSO (4:1) solution with a perovskite component (Cs$_{0.05}$FA$_{0.8}$MA$_{0.15}$PbBr$_{0.6}$I$_{2.4}$) with a concentration of 2.1 mol/L by using a spin coating process, where a rotation speed of spin coating is 2000 rpm; and perform extraction by using anisole, and then perform annealing at 100° C. for 20 min, to form a perovskite light absorption layer (average thickness: 2500 nm).

Step 9: Sequentially prepare a LiF thin film layer (thickness: 1 nm) and a C$_{60}$ thin film layer (thickness: 10 nm) on the perovskite light absorption layer by using the vacuum evaporation process, to be used as an electron transport interface layer (thickness: 11 nm).

Step 10: Prepare an electron transport layer (thickness: 10 nm) with a material of SnO$_2$ by using an atomic layer deposition process (ALD).

Step 11: Form a second transparent conductive layer (thickness: 100 nm) with a material of ITO on the electron transport layer by using the magnetron sputtering process.

Step 12: Form a silver electrode on the first transparent conductive layer and the second transparent conductive layer by using a screen printing process.

Comparative Example 3

A method for manufacturing a perovskite-n-type-silicon-based laminated solar cell provided in an embodiment of this application specifically includes the following steps:

Step 1: Provide a commercial-grade n-type silicon wafer with a resistivity of 3 Ω·cm, a thickness of 180 m, and a textured size of 4 m; and sequentially perform texturizing and cleaning on the silicon wafer, to form an n-type monocrystalline silicon substrate having a textured structure.

Step 2: Deposit intrinsic amorphous silicon passivation layers (thickness: 5 nm) on two sides of the n-type monocrystalline silicon substrate by using a PECVD device, to form a first passivation layer located on a front side of the n-type monocrystalline silicon substrate, and a second passivation layer located on a back side of the n-type monocrystalline silicon substrate.

Step 3: Deposit an n-type phosphorus-doped (doping concentration: 10$^{20}$ cm$^{-3}$) amorphous silicon layer (thickness: 10 nm) on the first passivation layer by using the PECVD device, to form a front-side emitter electrode.

Step 4: Deposit a p-type boron-doped (doping concentration: 10$^{19}$ cm$^{-3}$) amorphous silicon layer (thickness: 10 nm) on the second passivation layer by using the PECVD device, to form a back-field structure.

Step 5: Prepare a first transparent conductive layer (thickness: 100 nm) with a material of ITO on the p-type amorphous silicon layer by using a magnetron sputtering process.

Step 6: Sequentially deposit an n-type doped microcrystalline silicon layer and a p-type doped microcrystalline silicon layer on the n-type amorphous silicon layer by using the PECVD device, to form a tunneling recombination layer (thickness: 8 nm).

Step 7: Prepare an electron transport layer (thickness: 15 nm) with a material of $C_{60}$ on the tunneling recombination layer by using a vacuum evaporation process, where an evaporation rate is 0.2 A/s.

Step 8: Form lead iodide and cesium bromide on the electron transport layer by using the vacuum evaporation process, where a rate of cesium bromide (CsBr) is 0.1 A/s, a rate of lead iodide (PbI$_2$) is 2 A/s, and a total thickness is 400 nm;

configure a mixed solution of FAI and FABr, where a molar concentration ratio of FAI to FABr is 3:1, and a solvent is ethanol or isopropanol; take 80 μL of the mixed solution of FAI and FABr, spin-coat it on lead iodide and cesium bromide layers, and perform reaction, to form a perovskite thin film (thickness: 550 nm); and perform annealing on the second perovskite layer at 150° C. for 20 min, to form a perovskite light absorption layer (average thickness: 550 nm).

Step 9: Prepare a hole transport layer (thickness: 10 nm) with a material of Spiro-TTB on the perovskite light absorption layer by using the vacuum evaporation process.

Step 10: Prepare a buffer layer (thickness: 10 nm) with a material of NiOx on the hole transport layer by using an atomic layer deposition process (ALD).

Step 11: Form a second transparent conductive layer (thickness: 100 nm) with a material of ITO on the hole transport layer by using the magnetron sputtering process.

Step 12: Form a silver electrode on the first transparent conductive layer and the second transparent conductive layer by using a screen printing process.

To verify the performance of the laminated solar cell, testing was performed on performance parameters such as photoelectric conversion efficiency, fill factors, open-circuit voltages, and short-circuit currents of devices prepared in Embodiment 1, Embodiment 4, Embodiment 8, Comparative Example 1, Comparative Example 2, and Comparative Example 3 under a same effective area. For comparison of the performance parameters, refer to Table 1.

In the descriptions of the foregoing implementations, the described specific features, structures, materials, or characteristics may be combined in a proper manner in any one or more of the embodiments or examples.

The foregoing descriptions are merely specific implementations of this application, but are not intended to limit the protection scope of this application. Any variation or replacement readily figured out by a person skilled in the art within the technical scope disclosed in this application shall fall within the protection scope of this application Therefore, the protection scope of this application shall be subject to the protection scope of the claims.

The foregoing described apparatus embodiments are merely examples. The units described as separate parts may or may not be physically separate, and the parts displayed as units may or may not be physical units, may be located in one position, or may be distributed on a plurality of network units. Some or all of the modules may be selected according to actual needs to achieve the objectives of the schemes of the embodiments. A person of ordinary skill in the art may understand and implement the method without any creative effort.

"One embodiment", "Embodiment", or "one or more embodiments" mentioned in this specification mean that particular features, structures, or characteristics described with reference to the embodiments may be included in at least one embodiment of this application. In addition, the word example of "in an embodiment" herein does not necessarily all refer to a same embodiment.

In this specification provided herein, numerous specific details are described. However, it can be understood that, the embodiments of this application may be practiced without these specific details. In some instances, well-known methods, structures, and technologies are not shown in detail, so that understanding of this specification is not obscured.

Finally, it should be noted that the foregoing embodiments are merely used for describing the technical schemes of this application, but are not intended to limit this application. It should be understood by a person of ordinary skill in the art that although this application has been described in detail

| Type | Effective area (cm$^2$) | Conversion efficiency (Eff) (%) | Open-circuit voltage (Voc) (V) | Short-circuit current (Isc) (mA/cm$^2$) | Fill factor (FF) (%) |
|---|---|---|---|---|---|
| Embodiment 1 | 1.21 | 28.0 | 1.80 | 20.2 | 77 |
| Embodiment 4 | 1.21 | 27.9 | 1.82 | 20.2 | 76 |
| Embodiment 8 | 1.21 | 26.9 | 1.85 | 19.9 | 73 |
| Comparative example 1 | 1.21 | 25.2 | 1.65 | 20.4 | 75 |
| Comparative example 2 | 1.21 | 23.5 | 1.81 | 17.8 | 73 |
| Comparative example 3 | 1.21 | 24.6 | 1.72 | 19.3 | 74 |

It can be learned from Table 1 that, compared with the conventional laminated solar cell prepared by using only the solution method or the vacuum evaporation method, for the perovskite-silicon-based laminated solar cell provided in the embodiments of this application, both the open-circuit voltage and the short-circuit current are improved, and the conversion efficiency is also improved. It can be seen that, the perovskite-silicon-based laminated solar cell manufactured by using the manufacturing method provided in the embodiments of this application can have both a high open-circuit voltage and a high short-circuit current, and the photoelectric conversion efficiency is further improved.

with reference to the foregoing embodiments, modifications can be made to the technical schemes described in the foregoing embodiments, or equivalent replacements can be made to some technical features in the technical schemes, without departing from the spirit and scope of the technical schemes of the embodiments of this application.

What is claimed is:

1. A method for manufacturing a solar cell, comprising:
providing a substrate, wherein the substrate comprises a silicon-based bottom solar cell, a charge recombination layer, and a first carrier transport layer that are sequentially laminated, wherein the first carrier transport layer has a textured structure; and forming, on the first carrier transport layer, a perovskite light absorption layer comprising:

forming a first perovskite layer of the perovskite light absorption layer on the first carrier transport layer based on a solution method performed with a perovskite solution comprising a solute that is a hybrid perovskite component $Cs_xFA_yMA_zPbBr_mI_n$ (x+y+z=1 and m+n=3); and after forming the first perovskite layer, forming a second perovskite layer of the perovskite light absorption layer based on a perovskite skeleton vacuum evaporation method, wherein an average thickness of the first perovskite layer is less than or equal to half a height of the textured structure.

2. The method according to claim 1, wherein a solvent of the solution comprises one or more of N, N-dimethylformamide or dimethylsulfoxide.

3. The method according to claim 1, wherein forming the second perovskite layer based on the perovskite skeleton vacuum evaporation method comprises:

forming a perovskite skeleton through vacuum evaporation; and forming the second perovskite layer through a reaction between the perovskite skeleton and organic amine, wherein the perovskite skeleton is a mixture of two or more of $PbX_2$ or CsY, where X and Y are each selected from one or more of $Cl^-$, $Br^-$, $I^-$, or $SCN^-$, and wherein the organic amine is one or more of formamidine hydroiodide, methylamine bromide, or formamidine hydrobromide.

4. The method according to claim 2, wherein a concentration of the solution ranges from 0.2 mol/L to 3 mol/L.

5. The method according to claim 1, wherein forming the second perovskite layer based on the perovskite skeleton vacuum evaporation method comprises:

spin-coating an organic amine solution on a perovskite skeleton, wherein a rotation speed of the spin-coating ranges from 500 rpm to 6000 rpm, and a thickness of the perovskite skeleton ranges from 50 nm to 1000 nm.

6. The method according to claim 1, wherein after forming the perovskite light absorption layer, forming, in sequence, a second carrier transport layer, a transparent conductive layer, and an electrode.

* * * * *